(12) United States Patent  
Krumpelman et al.

(10) Patent No.: US 9,177,733 B2
(45) Date of Patent: Nov. 3, 2015

(54) TOUCHSURFACE ASSEMBLIES WITH LINKAGES

(71) Applicant: SYNAPTICS INCORPORATED, Santa Clara, CA (US)

(72) Inventors: Douglas M. Krumpelman, Hayden, ID (US); Cody G. Peterson, Coeur d'Alene, ID (US); Peter Bokma, Coeur d'Alene, ID (US)

(73) Assignee: Synaptics Incorporated, Santa Clara, CA (US)

( * ) Notice: Subject to any disclaimer, the term of this patent is extended or adjusted under 35 U.S.C. 154(b) by 196 days.

(21) Appl. No.: 13/802,941

(22) Filed: Mar. 14, 2013

(65) Prior Publication Data

US 2014/0034468 A1 Feb. 6, 2014

Related U.S. Application Data

(60) Provisional application No. 61/680,255, filed on Aug. 6, 2012.

(51) Int. Cl.
| | |
|---|---|
| *H01H 13/705* | (2006.01) |
| *H01H 3/14* | (2006.01) |

(Continued)

(52) U.S. Cl.
CPC .............. *H01H 3/122* (2013.01); *H01H 11/04* (2013.01); *H01H 13/705* (2013.01); *H03K 17/9622* (2013.01); *H03K 17/975* (2013.01); *H01H 2221/026* (2013.01); *H01H 2221/04* (2013.01);

(Continued)

(58) Field of Classification Search
CPC ................................ H01H 3/125; H01H 13/14

USPC .................................................. 200/5 A, 344
See application file for complete search history.

(56) References Cited

U.S. PATENT DOCUMENTS 3,886,341 A  5/1975  Forrest
3,938,642 A  2/1976  Van Rumpt et al.
(Continued)

FOREIGN PATENT DOCUMENTS

CN  102035525 A  4/2011
CN  102832921 A  12/2012
(Continued)

OTHER PUBLICATIONS

International Searching Authority, Search Report and Written Opinion for International Application No. PCT/US2013/053555, mailed Dec. 27, 2013.

(Continued)

*Primary Examiner* — Felix O Figueroa
*Assistant Examiner* — Ahmed Saeed
(74) *Attorney, Agent, or Firm* — Osha Liang LLP

(57) ABSTRACT

A key assembly in accordance with embodiments of the invention comprises a base, a keycap, a biasing mechanism, a first linkage, and a second linkage. The keycap is spaced from the base along a press direction and configured to move between an unpressed position and a pressed position relative to the base. The unpressed and pressed positions are separated by a first amount in the press direction and a second amount in a lateral direction orthogonal to the press direction. The first amount is at least as much as the second amount and no larger than twice the second amount. The biasing mechanism is configured to bias the keycap away from the base. The first and second linkages are rotatably coupled to the base and the keycap.

17 Claims, 9 Drawing Sheets

(51) Int. Cl.
  *H01H 3/12* (2006.01)
  *H03K 17/96* (2006.01)
  *H01H 11/04* (2006.01)
  *H03K 17/975* (2006.01)

(52) U.S. Cl.
  CPC ...... *H01H 2237/00* (2013.01); *H01H 2239/006* (2013.01); *Y10T 29/49105* (2015.01)

(56) References Cited

U.S. PATENT DOCUMENTS

| | | |
|---|---|---|
| 4,039,068 A | 8/1977 | Giorza et al. |
| 4,056,701 A | 11/1977 | Weber |
| 4,265,557 A | 5/1981 | Runge |
| 4,269,521 A | 5/1981 | Longrod |
| 4,294,555 A | 10/1981 | Galaske et al. |
| 4,315,114 A | 2/1982 | Monti, Jr. |
| 4,326,195 A | 4/1982 | Seki et al. |
| 4,334,280 A | 6/1982 | Mcdonald |
| 4,403,123 A | 9/1983 | Shek |
| 4,480,162 A | 10/1984 | Greenwood |
| D278,239 S | 4/1985 | Felix et al. |
| D284,574 S | 7/1986 | Fischer |
| D292,801 S | 11/1987 | Davis et al. |
| 4,735,520 A | 4/1988 | Suzuki et al. |
| 4,786,766 A | 11/1988 | Kobayashi |
| 4,885,565 A | 12/1989 | Embach |
| D312,623 S | 12/1990 | Carter et al. |
| 5,053,591 A | 10/1991 | Theurer |
| 5,121,091 A | 6/1992 | Fujiyama |
| 5,189,390 A | 2/1993 | Fagard |
| 5,212,473 A | 5/1993 | Louis |
| 5,239,152 A | 8/1993 | Caldwell et al. |
| 5,329,278 A | 7/1994 | Dombroski |
| 5,418,530 A | 5/1995 | Moore et al. |
| 5,463,195 A | 10/1995 | Watanabe et al. |
| 5,523,730 A | 6/1996 | Van Zeeland |
| 5,575,576 A | 11/1996 | Roysden, Jr. |
| 5,626,223 A | 5/1997 | Lee |
| 5,666,096 A | 9/1997 | Van Zeeland |
| 5,667,061 A | 9/1997 | Lee |
| 5,763,842 A | 6/1998 | Tsai et al. |
| 5,767,463 A | 6/1998 | Gandre |
| 5,779,030 A | 7/1998 | Ikegami et al. |
| 5,828,015 A | 10/1998 | Coulon |
| 5,867,082 A | 2/1999 | Van Zeeland |
| 5,902,972 A | 5/1999 | Nestor et al. |
| 5,921,382 A | 7/1999 | Retter |
| 5,934,454 A | 8/1999 | Burleson et al. |
| 5,973,670 A | 10/1999 | Barber et al. |
| 5,977,867 A | 11/1999 | Blouin |
| 5,977,888 A | 11/1999 | Fujita et al. |
| 5,982,304 A | 11/1999 | Selker et al. |
| 6,039,258 A | 3/2000 | Durbin et al. |
| 6,046,730 A | 4/2000 | Bowen et al. |
| 6,067,081 A | 5/2000 | Hahlganss et al. |
| 6,069,545 A | 5/2000 | Van Zeeland |
| 6,069,552 A | 5/2000 | Van Zeeland |
| 6,118,435 A | 9/2000 | Fujita et al. |
| 6,130,593 A | 10/2000 | Van Zeeland |
| 6,166,662 A | 12/2000 | Chuang |
| 6,218,966 B1 | 4/2001 | Goodwin et al. |
| 6,219,034 B1 | 4/2001 | Elbing et al. |
| 6,262,646 B1 | 7/2001 | Van Zeeland |
| 6,262,717 B1 | 7/2001 | Donohue et al. |
| 6,305,071 B1 | 10/2001 | Van Zeeland |
| 6,328,489 B1 | 12/2001 | Chi-Pin |
| 6,369,692 B1 | 4/2002 | Van Zeeland |
| 6,369,803 B2 | 4/2002 | Brisebois et al. |
| 6,373,463 B1 | 4/2002 | Beeks |
| 6,375,372 B1 | 4/2002 | Tsau |
| 6,392,515 B1 | 5/2002 | Van Zeeland et al. |
| 6,400,246 B1 | 6/2002 | Hill et al. |
| 6,429,846 B2 | 8/2002 | Rosenberg et al. |
| 6,430,023 B1 | 8/2002 | Suzuki |
| 6,455,794 B2 | 9/2002 | Sato et al. |
| 6,466,118 B1 | 10/2002 | Van Zeeland et al. |
| 6,509,818 B2 | 1/2003 | Van Zeeland |
| 6,542,058 B2 | 4/2003 | Van Zeeland |
| 6,556,112 B1 | 4/2003 | Van Zeeland et al. |
| 6,563,434 B1 | 5/2003 | Olodort et al. |
| 6,566,616 B1 | 5/2003 | Ha |
| 6,657,139 B2 | 12/2003 | Hasunuma |
| 6,677,843 B1 | 1/2004 | Monroe et al. |
| 6,693,626 B1 | 2/2004 | Rosenberg |
| 6,723,935 B1 | 4/2004 | Watanabe |
| 6,723,937 B2 | 4/2004 | Engelmann et al. |
| 6,750,415 B2 | 6/2004 | Yamagami |
| 6,761,494 B2 * | 7/2004 | Hsu et al. ...................... 400/495 |
| 6,819,990 B2 | 11/2004 | Ichinose |
| 6,822,635 B2 | 11/2004 | Shahoian et al. |
| 6,880,994 B2 | 4/2005 | Takahashi |
| 6,911,901 B2 | 6/2005 | Bown |
| 6,937,124 B1 | 8/2005 | Nakamura et al. |
| 6,939,065 B2 | 9/2005 | Roysden, Jr. |
| 6,940,030 B2 | 9/2005 | Takeda et al. |
| 6,982,617 B2 | 1/2006 | Brilon et al. |
| D527,004 S | 8/2006 | Yen |
| 7,106,305 B2 | 9/2006 | Rosenberg |
| 7,113,177 B2 | 9/2006 | Franzen |
| 7,119,798 B2 | 10/2006 | Yoshikawa et al. |
| 7,148,789 B2 | 12/2006 | Sadler et al. |
| 7,166,795 B2 | 1/2007 | Lengeling |
| 7,182,691 B1 | 2/2007 | Schena |
| 7,196,688 B2 | 3/2007 | Schena |
| 7,215,329 B2 | 5/2007 | Yoshikawa et al. |
| 7,224,106 B2 | 5/2007 | Pei et al. |
| 7,227,537 B2 | 6/2007 | Nakayama et al. |
| 7,269,484 B2 | 9/2007 | Hein |
| 7,292,227 B2 | 11/2007 | Fukumoto et al. |
| 7,312,791 B2 | 12/2007 | Hoshino et al. |
| 7,324,094 B2 | 1/2008 | Moilanen et al. |
| 7,336,266 B2 | 2/2008 | Hayward et al. |
| 7,339,572 B2 | 3/2008 | Schena |
| 7,342,573 B2 | 3/2008 | Ryynaenen |
| 7,375,656 B2 | 5/2008 | Mueller et al. |
| 7,385,308 B2 | 6/2008 | Yerdon et al. |
| 7,400,319 B2 | 7/2008 | Nakayama et al. |
| 7,450,110 B2 | 11/2008 | Shahoian et al. |
| 7,525,415 B2 | 4/2009 | Yatsu et al. |
| 7,548,232 B2 | 6/2009 | Shahoian et al. |
| 7,567,232 B2 | 7/2009 | Rosenberg |
| 7,569,786 B2 | 8/2009 | Spies |
| 7,573,460 B2 | 8/2009 | Strawn et al. |
| 7,579,758 B2 | 8/2009 | Maruyama et al. |
| 7,589,607 B2 | 9/2009 | Rochon et al. |
| 7,592,901 B2 | 9/2009 | Furusho |
| 7,592,999 B2 | 9/2009 | Rosenberg et al. |
| 7,602,384 B2 | 10/2009 | Rosenberg et al. |
| 7,607,087 B2 | 10/2009 | Prados |
| 7,701,440 B2 | 4/2010 | Harley |
| 7,855,715 B1 | 12/2010 | Bowen |
| 7,868,515 B2 | 1/2011 | Krochmal et al. |
| 7,898,440 B2 | 3/2011 | Chen |
| 7,969,288 B2 | 6/2011 | Braun et al. |
| 7,982,720 B2 | 7/2011 | Rosenberg et al. |
| 8,031,181 B2 | 10/2011 | Rosenberg et al. |
| 8,059,105 B2 | 11/2011 | Rosenberg et al. |
| 8,094,130 B2 | 1/2012 | Griffin et al. |
| 8,199,033 B2 | 6/2012 | Peterson et al. |
| 8,203,531 B2 | 6/2012 | Peterson et al. |
| 8,217,289 B2 | 7/2012 | Liu |
| 8,222,799 B2 | 7/2012 | Polyakov et al. |
| 8,232,969 B2 | 7/2012 | Grant et al. |
| 8,248,277 B2 | 8/2012 | Peterson et al. |
| 8,248,278 B2 | 8/2012 | Schlosser et al. |
| 8,274,478 B2 | 9/2012 | Bowen |
| 8,309,870 B2 | 11/2012 | Peterson et al. |
| 8,310,351 B2 | 11/2012 | Krahenbuhl et al. |
| 8,310,444 B2 | 11/2012 | Peterson et al. |
| 8,451,426 B2 | 5/2013 | Iino |
| 8,648,737 B1 | 2/2014 | Bowen |
| 8,674,941 B2 | 3/2014 | Casparian et al. |
| 2001/0002648 A1 | 6/2001 | Van Zeeland |

(56) References Cited

U.S. PATENT DOCUMENTS

| | | |
|---|---|---|
| 2002/0054060 A1 | 5/2002 | Schena |
| 2002/0084721 A1 | 7/2002 | Walczak |
| 2002/0149561 A1 | 10/2002 | Fukumoto et al. |
| 2003/0067449 A1 | 4/2003 | Yoshikawa et al. |
| 2003/0209131 A1 | 11/2003 | Asahi |
| 2003/0210233 A1 | 11/2003 | Frulla |
| 2004/0252104 A1 | 12/2004 | Nakamura et al. |
| 2005/0017947 A1 | 1/2005 | Shahoian et al. |
| 2005/0089356 A1 | 4/2005 | Jung-Tsung |
| 2005/0157893 A1 | 7/2005 | Pelrine et al. |
| 2005/0204906 A1 | 9/2005 | Lengeling |
| 2005/0237309 A1 | 10/2005 | Sharma |
| 2006/0232559 A1 | 10/2006 | Chien et al. |
| 2006/0256075 A1 | 11/2006 | Anastas et al. |
| 2006/0261983 A1 | 11/2006 | Griffin et al. |
| 2007/0031097 A1 | 2/2007 | Heikenfeld et al. |
| 2007/0080951 A1 | 4/2007 | Maruyama et al. |
| 2007/0091070 A1 | 4/2007 | Larsen et al. |
| 2007/0102274 A1 | 5/2007 | Liu |
| 2007/0146317 A1 | 6/2007 | Schena |
| 2007/0146334 A1 | 6/2007 | Inokawa |
| 2007/0152974 A1 | 7/2007 | Kim et al. |
| 2007/0165002 A1 | 7/2007 | Wassingbo |
| 2007/0193436 A1 | 8/2007 | Chu |
| 2007/0205988 A1 | 9/2007 | Gloyd et al. |
| 2007/0234887 A1 | 10/2007 | Sawada et al. |
| 2007/0234890 A1 | 10/2007 | Yamashita |
| 2007/0236449 A1 | 10/2007 | Lacroix et al. |
| 2007/0236450 A1 | 10/2007 | Colgate et al. |
| 2008/0007529 A1 | 1/2008 | Paun et al. |
| 2008/0042980 A1 | 2/2008 | Bowen |
| 2008/0062015 A1 | 3/2008 | Bowen |
| 2008/0083314 A1 | 4/2008 | Hayashi et al. |
| 2008/0084384 A1 | 4/2008 | Gregorio et al. |
| 2008/0087476 A1 | 4/2008 | Prest et al. |
| 2008/0092720 A1 | 4/2008 | Yamashita et al. |
| 2008/0100568 A1 | 5/2008 | Koch et al. |
| 2008/0165127 A1 | 7/2008 | Eom |
| 2008/0264770 A1 | 10/2008 | Purcocks |
| 2008/0289952 A1 | 11/2008 | Pelrine et al. |
| 2008/0302647 A1* | 12/2008 | Villain et al. ............. 200/343 |
| 2008/0303782 A1 | 12/2008 | Grant et al. |
| 2009/0002205 A1 | 1/2009 | Klinghult et al. |
| 2009/0072662 A1 | 3/2009 | Sadler et al. |
| 2009/0073128 A1 | 3/2009 | Marsden |
| 2009/0079593 A1 | 3/2009 | Yamakawa et al. |
| 2009/0088220 A1 | 4/2009 | Persson |
| 2009/0128501 A1 | 5/2009 | Lazaridis et al. |
| 2009/0178913 A1 | 7/2009 | Peterson et al. |
| 2009/0189790 A1 | 7/2009 | Peterson et al. |
| 2009/0189873 A1 | 7/2009 | Peterson et al. |
| 2009/0210568 A1 | 8/2009 | Peterson et al. |
| 2009/0231277 A1 | 9/2009 | Peterson et al. |
| 2009/0255793 A1 | 10/2009 | Krochmal et al. |
| 2010/0025216 A1* | 2/2010 | Huang .................. 200/522 |
| 2010/0171715 A1 | 7/2010 | Peterson et al. |
| 2010/0231423 A1 | 9/2010 | Yang |
| 2010/0243420 A1 | 9/2010 | Lin |
| 2010/0245231 A1 | 9/2010 | Aramaki |
| 2010/0253629 A1 | 10/2010 | Orsley |
| 2010/0259481 A1 | 10/2010 | Oh |
| 2010/0309130 A1 | 12/2010 | Zhao et al. |
| 2010/0321301 A1 | 12/2010 | Casparian et al. |
| 2010/0328251 A1 | 12/2010 | Sinclair |
| 2011/0025607 A1 | 2/2011 | Bowen |
| 2011/0056818 A1 | 3/2011 | Maruyama et al. |
| 2011/0095919 A1 | 4/2011 | Ostermoller et al. |
| 2011/0096013 A1 | 4/2011 | Krumpelman et al. |
| 2011/0128239 A1 | 6/2011 | Polyakov et al. |
| 2011/0203912 A1 | 8/2011 | Niu |
| 2011/0205161 A1 | 8/2011 | Myers et al. |
| 2011/0227762 A1 | 9/2011 | Bowen |
| 2011/0227872 A1 | 9/2011 | Huska et al. |
| 2011/0234494 A1 | 9/2011 | Peterson et al. |
| 2012/0019445 A1 | 1/2012 | Liu |
| 2012/0043191 A1 | 2/2012 | Kessler et al. |
| 2012/0092263 A1 | 4/2012 | Peterson et al. |
| 2012/0119996 A1 | 5/2012 | Wu et al. |
| 2012/0169603 A1* | 7/2012 | Peterson et al. ............. 345/168 |
| 2012/0268384 A1 | 10/2012 | Peterson et al. |
| 2012/0299832 A1 | 11/2012 | Peterson et al. |
| 2013/0082932 A1 | 4/2013 | Gluckstad et al. |
| 2013/0093681 A1 | 4/2013 | Hsu |
| 2013/0135207 A1 | 5/2013 | Neil et al. |
| 2013/0201109 A1* | 8/2013 | Knighton et al. ............. 345/169 |
| 2013/0314325 A1 | 11/2013 | Furukawa |
| 2013/0342494 A1 | 12/2013 | Feng |
| 2014/0001021 A1 | 1/2014 | Zhang |
| 2014/0034468 A1 | 2/2014 | Krumpelman et al. |
| 2014/0055363 A1 | 2/2014 | Meierling et al. |

FOREIGN PATENT DOCUMENTS

| | | |
|---|---|---|
| CN | 202694270 U | 1/2013 |
| DE | 19704253 A | 8/1998 |
| DE | 10126670 A1 | 12/2002 |
| DE | 2005002417 A | 4/2005 |
| DE | 2004005501 A | 8/2005 |
| EP | 0278916 A | 8/1988 |
| EP | 1548776 A | 6/2005 |
| EP | 2287873 A | 2/2011 |
| JP | 2000348562 A | 12/2000 |
| JP | 2007173087 A | 7/2007 |
| JP | 2011233406 A | 11/2011 |

OTHER PUBLICATIONS

"Elastomers: Powerful Polymer", Retrieved from <http://appliancedesign.com/copyright/>, (Jun. 2006),5 pages.

"Haptic Touch Technology", Pacinian,(Nov. 2007),2 pages.

"Haptics: Learning Through Touch", Retrieved from <http://ced.ncsu.edu/nanoscale/haptics.htm>, (2004),5 pages.

"International Search Report and Written Opinion", Application No. PCT/US2010/020380, (Apr. 12, 2010),10 pages.

"Nanoactuators Based on Electrostatic Forces on Dielectrics", Retrieved from <http://www.nasatech.com/Briefs/Apr05/NPO30747.html>on Nov. 28, 2005, NASA's Jet Propulsion Laboratory, Pasadena, CA,4 pages.

New SRI International sSpin-Off, Artificial Muscle, Inc., Secure Series a Funding from Leading VC Firms, Retrieved from <http://www.sri.com/news/releases/05-03-04.html> on Jan. 30, 2008, SRI International Spin Offs Artificial Muscle, Inc,(May 2004),2 pages.

"Non-Final Office Action mailed Dec. 9, 2011", Application U.S. Appl. No. 12/580,002, 21 pages.

"Proposed Experiment Protocol and Details", Retrieved from <http://bdml.stanford.edu/twiki/bin/view/Haptics/ProposedExperi0mentPr- otocolAndDetails>, 5 pages.

"Tactile Perception and Design", Retrieved from http://www.tireesias.org/reports.tpd2.htm on Apr. 4, 2006, 10 pages.

"Touch and Haptics", 2004 IEEE/ RSJ International Conference on Intelligent Robots and Systems, (Sep. 28, 2004),32 pages.

"Touch-Hapsys", Retrieved from <http://www.touch-hapsys.org>, 2 pages.

Ashley, Steven "Artificial Muscles", Scientific American, Available at <www.sciam.com>,(Oct. 2003),pp. 53-59.

Bar-Cohen, Y. "Electroactive Polymer (EAP) Actuators as Artificial Muscles—Reality, Potential and Challenges", SPIE Press, (Mar. 18, 2004),pp. 26 and 548-550.

Bar-Cohen, Yoseph "Electric Flex", IEEE Spectrum Online, (Jun. 2004),6 pages.

Bar-Cohen, Yoseph "Electroactive Polymers as Artificial Muscles—Capabilities, Potentials and Challenges", Robotics 2000, Available at <www.spaceandrobotics>,(Feb. 28-Mar. 2, 2000),pp. 1-8.

Bar-Cohen, Yoseph "Electroactive Polymers", Retrieved from <http://electrochem.cwru.edu/ed/encycl/>, Electrochemistry Encyclopedia,(Dec. 2004),7 pages.

Bar-Cohen, Yoseph "Low Mass Muscle Actuators (LoMMAs)", Telerobotic Task Sponsored by NASA HQ, Code S, (Oct. 23, 1997),18 pages.

(56) References Cited

OTHER PUBLICATIONS

Bar-Cohen, Yoseph "Worldwide Electroactive Polymers", (Artificial Muscles) Newsletter, vol. 7, No. 2, Available at <http://eap.jpl.nasa.gov>,(Dec. 2005),pp. 1-16.

Bar-Cohen, Yoseph et al., "Enabling Novel Planetary and Terrestrial Mechanisms Using Electroactive Materials at the JPL's NDEAA Lab", Retrieved from http://ndeaa.jpl.nasa.gov>, pp. 1-6.

Bark, Karlin "Functional Prototype I", Retrieved from <http://bdml.stanford.edu/twiki/bin/view/Haptics/FunctionalPrototypeI?-skin=print.pattern>, (Aug. 9, 2005),3 pages.

Beavers, Alex "Basic Concepts for Commercial Applications of Electroactive Polymer Artificial Muscle", Artificial Muscle Incorporated, Menlo Park, CA,10 pages.

Bicchi, Antonio et al., "Haptic Illusions Induced by the Tactile Flow", Interdepartmental Research Centre "E. Piaggo", University of Pisa,12 pages.

Bifano, Thomas "Parallel Plate Electrostatic Actuation for High-Resolution Deformable Mirrors", Boston University, (Aug. 19, 2004),35 pages.

Bifano, Thomas, "Parallel Plate Electrostatic Actuation for High-Resolution Deformable Mirrors", Boston University, Boston, MA, Aug. 19, 2004.

Biggs, James "Some Useful Information for Tactile Display Design", IEEE Transactions on Man-Machine Systems, vol. 11, No. 1,(1970),pp. 19-24.

Carpi, Federico et al., "Dielectric Elastomers as Electromechanical Transducers: Fundamentals, Materials, Devices, Models and Applications of an Emerging Elecrotactive Polymer Technology", Elsevier Ltd., (2008),12 pages.

Fontaine, Ebraheem "A Laboratory Demonstration of a Parallel Robotic Mechanism", Massachusetts Institute of Technology,(Jun. 2002),pp. 1 -14.

Fukumoto, Masaki, et al, "Active Click: Tactile Feedback for Touch Panels", NTT DoCoMo Multimedia Labs, Mar. 31, 2001, 2 pages.

Gorinevsky, Dimitry "Adaptive membrane for large lightweight space telescopes", SPIE Astronomical Telescopes and Instrumentation,(2002),pp. 1-9.

Hayward, Vincent et al., "Tactile Display Device Using Distributed Lateral Skin Stretch", Proceedings of the Haptic Interfaces for Virtual Environment and Teleoperator Systems Symposium, ASME International Mechanical Engineering Congress & Exposition,(2000),pp. 1309-1314.

Hollis, Ralph "Haptics", Berkshire Encyclopedia of Human-Computer Interaction, Berkshire Publishing Group,(2004), pp. 311-316.

Jager, Edwin et al., "Microfabricating Conjugated Polymer Actuators", Science Magazine, vol. 290, www.sciencemag.org,(Nov. 24, 2000),pp. 1540-1544.

Jones, Gail et al., "A Comparison of Learning with Haptic and Visual Modalities", National Science Foundation REC-0087389,pp. 1-20.

Jones, Lynette "Human Factors and Haptic Interfaces", Department of Mechanical Engineering, Massachusetts Institute of Technology,40 pages.

Jungmann, M., et al, Miniaturised Electrostatic Tactile Display with High Structural Compliance, 2002, 6 pages.

Kajimoto, Hiroyuki et al., "Electro-Tactile Display with Tactile Primary Color Approach", Graduate School of Information and Technology, The University of Tokyo,2 pages.

Mackenzie, Scott, et al, "The Tactile Touchpad", 1997, 5 pages.

Mackenzie, Scott, et al., "A Comparison of Three Selection Techniques for Touchpads", Proceedings of the CHI'98 Conference on Human Factors in Computing Systems, pp. 336-343 New York 1998.

Mok Ha, Soon et al., "Interpenetrating Polymer Networks for High-Performance Electroelastomer Artificial Muscles", Department of Materials Science and Engineering, UCLA,pp. 1-19.

Non-Final Office Action mailed Feb. 13, 2009, U.S. Appl. No. 11/945,879.

Odell, D.L. et al., "MicroRobot Conveyance and Propulsion System Using Comb Drive and Parallel Plate Actuators: The ScuttleBot", UC Berkley,4 pages.

O'Halloran, A et al., "Materials and Technologies for Artificial Muscle: A Review for the Mechatronic Muscle Project", Topics in Bio-Mechanical Engineering, Chapter 7, Department of Electronic Engineering, National University of Ireland Galway,(2004),pp. 184-215.

Oniszczak, Aleks, "VersaPad Driver Plus Pack", 1999, 3 pages.

Pasquero, Jerome "Stimulation of the Fingertip by Lateral Skin Strech", Retrieved from <http://www.cim.mcgill.ca/.about.jay/index.sub.--files/research.htm>- ;, 5 pages.

Pasquero, Jerome "Stress: A Tactile Display Using Lateral Skin Stretch", Department of Electrical and Computer Engineering McGill University, Montreal,(Oct. 2003),75 pages.

Pasquero, Jerome "Survey on Communication Through Touch", Technical Report: TR-CIM 06.04, Center for Intelligent Machines Department of Electrical and Computer Engineering,(Jul. 2006),pp. 1-27.

Pasquero, Jerome "Tactile Display Survey", Technical Report TR-CIM 06.04,6 pages.

Pei, Qibing et al., "Multiple-Degrees-of-Freedom Electroelastomer Roll Actuators", SRI International Institute of Physics Publishing, (2004),pp. N86-N92.

Poupyrev, Ivan, et al., "Tactile Interfaces for Small Touch Screens", 2003, 4 pages.

Poupyrev, Ivan, et al., "TouchEngine: A Tactile Display for Handheld Devices", 2002, 2 pages.

Raisamo, Roope "Tactile User Interfaces", New Interaction Techniques,(Aug. 2, 2001),30 pages.

Seeger, Joseph et al., "Dynamics and Control of Parallel-Plate Actuators Beyond the Electrostatic Instability", Transducers 99 The 10th International Conference on Solid State Sensors and Actuators, (Jun. 1999),pp. 474-477.

Sommer-Larsen, Peter "Artificial Muscles", Rise National Laboratory, Condensed Matter Physics and Chemistry Department,3 pages.

Spires, Shelby "Artificial Strongman", Smart Business: For The New Economy, (Nov. 2000),1 page.

Srinivasan, Mandayam A., et al, "Role of Skin Biomechanics in Mechanoreceptor Response", Retrieved from <http://touchlab.mit.edu/oldresearch/currentwork/humanhaptics/roleofsk- inbiomechanics/> on Dec. 20, 2007, MIT Touch Lab, (Dec. 20, 2007),pp. 1-13.

Supplemental Notice of Allowance mailed May 20, 2010, U.S. Appl. No. 11/945,879, 5 pages.

Wagner, Christopher et al., "Integrating Tactile and Force Feedback with Finite Element Models", Division of Engineering and Applied Sciences, Harvard University,6 pages.

Wagstaff, Jeremy, "A Passion for the Keys", The Wall Street Journal Online, Nov. 23, 2007, 3 pages, retrieved from the Internet at online.wsj.com/article_print/SB119578337324301744.html.

Wing, Alan et al., "Multidimensional Haptics Preliminary Report", Retrieved from <http://www.touch-hapsys.org>, (Sep. 21, 2003),pp. 1-125.

Wingert, Andreas et al., "On the Kinematics of Parallel Mechanisms with Bio-stable Polymer Actuators", Department of Mechanical Engineering, Massachusetts Institute of Technology Cambridge,8 pages.

Wu, Xingtao et al., "A Generalized Capacitance-Based Model for Electrostatic Micro-Actuators", Department of Physics, New Jersey Institute of Technology, Newark, NJ, 07102-1982 Department of Mechanical Engineering, Columbia University, NY 10027, pp. 1-23.

Yang, Gi-Hun, "Novel Haptic Mouse System for Holistic Haptic Display and Potential of Vibrotactile Stimulation", Human-Robot Interaction Research Center, Korea Advanced Institute of Science and Technology, 2005, 17 pages.

Zou, Jun et al., "Design of a Wide Turning Range Micromachined Turnable Capacitor for Wireless Communications", First IEEE Electro/Information Technology Conference, Jun. 8-11, Chicago, IL, 2000, 6 pages.

Non-Final Office Action mailed May 14, 2012, U.S. Appl. No. 13/323,292, 19 pages.

Final Office Action mailed Aug. 1, 2012 for U.S. Appl. No. 12/580,002, 23 pages.

* cited by examiner

TOUCHSURFACE ASSEMBLIES WITH LINKAGES

RELATED APPLICATIONS

This application claims the benefit of U.S. Provisional Application No. 61/680,255 filed Aug. 6, 2012.

FIELD OF THE INVENTION

This invention generally relates to electronic devices.

BACKGROUND OF THE INVENTION

Pressable touchsurfaces (touch surfaces which can be pressed) are widely used in a variety of input devices, including as the surfaces of keys or buttons for keypads or keyboards, and as the surfaces of touch pads or touch screens. It is desirable to improve the usability of these input systems.

FIG. 2 shows a graph 200 of an example tactile response curve associated with the "snapover" haptic response found in many keys enabled with metal snap domes or rubber domes. Specifically, graph 200 relates force applied to the user by a touchsurface of the key and the amount of key displacement (movement relative to its unpressed position). The force applied to the user may be a total force or the portion of the total force along a particular direction such as the positive or negative press direction. Similarly, the amount of key displacement may be a total amount of key travel or the portion along a particular direction such as the positive or negative press direction.

The force curve 210 shows four key press states 212, 214, 216, 218 symbolized with depictions of four rubber domes at varying amounts of key displacement. The key is in the "unpressed" state 212 when no press force is applied to the key and the key is in the unpressed position (i.e. "ready" position). In response to press input, the key initially responds with some key displacement and increasing reaction force applied to the user. The reaction force increases with the amount of key displacement until it reaches a local maximum "peak force" $F_1$ in the "peak" state 214. In the peak state 214, the metal snap dome is about to snap or the rubber dome is about to collapse. The key is in the "contact" state 216 when the keycap, snap dome or rubber dome, or other key component moved with the keycap makes initial physical contact with the base of the key (or a component attached to the base) with the local minimum "contact force" $F_2$. The key is in the "bottom" state 218 when the key has travelled past the "contact" state and is mechanically bottoming out, such as by compressing the rubber dome in keys enabled by rubber domes.

A snapover response is defined by the shape of the reaction force curve—affected by variables such as the rate of change, where it peaks and troughs, and the associated magnitudes. The difference between the peak force $F_1$ and the contact force $F_2$ can be termed the "snap." The "snap ratio" can be determined as $(F_1-F_2)/F_1$ (or as $100*(F_1-F_2)/F_1$, if a percent-type measure is desired).

BRIEF SUMMARY OF THE INVENTION

Technology for touchsurface assemblies is discussed. Keyboards and other devices enabled with touchsurface assemblies are also discussed. An example key assembly implementation comprises a base, a keycap, a biasing mechanism, a first linkage, and a second linkage. The keycap is spaced from the base along a press direction and configured to move, relative to the base, between an unpressed position and a pressed position. The unpressed and pressed positions are separated by a first amount in the press direction and a second amount in a lateral direction orthogonal to the press direction. The first amount is at least as much as the second amount and no larger than twice the second amount. The biasing mechanism is configured to bias the keycap away from the base. The first linkage is rotatably coupled to the base and rotatably coupled to the keycap. The second linkage is rotatably coupled to the base and rotatably coupled to the keycap. In response to press force applied to the keycap, the biasing mechanism resists keycap movement toward the pressed position, and the first and second linkages together maintain the keycap in a substantially constant orientation relative to the base while guiding the keycap toward the pressed position. In response to a removal of the press force, the biasing mechanism biases the keycap toward the unpressed position.

BRIEF DESCRIPTION OF DRAWINGS

Example embodiments of the present invention will hereinafter be described in conjunction with the appended drawings which are not to scale unless otherwise noted, where like designations denote like elements, and.

DETAILED DESCRIPTION OF THE INVENTION

The following detailed description is merely exemplary in nature and is not intended to limit the invention or the application and uses of the invention.

Various embodiments of the present invention provide input devices and methods that facilitate improved usability, thinner devices, easier assembly, lower cost, more flexible industrial design, or a combination thereof. These input devices and methods involve pressable touchsurfaces that may be incorporated in any number of devices. As some examples, pressable touchsurfaces may be implemented as surfaces of touchpads, touchscreens, keys, buttons, and the surfaces of any other appropriate input device. Thus, some non-limiting examples of devices that may incorporate pressable touchsurfaces include personal computers of all sizes and shapes, such as desktop computers, laptop computers, netbooks, ultrabooks, tablets, e-book readers, personal digital assistants (PDAs), and cellular phones including smart phones. Additional example devices include data input devices (including remote controls, integrated keyboards or keypads such as those within portable computers, or peripheral keyboards or keypads such as those found in tablet covers or stand-alone keyboards, control panels, and computer mice), and data output devices (including display screens and printers). Other examples include remote terminals, kiosks, point-of-sale devices, video game machines (e.g., video game consoles, portable gaming devices, and the like) and media devices (including recorders, editors, and players such as televisions, set-top boxes, music players, digital photo frames, and digital cameras).

The discussion herein focuses largely on rectangular touchsurfaces. However, the touchsurfaces for many embodiments can comprises other shapes. Example shapes include triangles, quadrilaterals, pentagons, polygons with other numbers of sides, shapes similar to polygons with rounded corners or nonlinear sides, shapes with curves, elongated or circular ellipses circles, combinations shapes with portions of any of the above shapes, non-planar shapes with concave or convex features, and any other appropriate shape.

In addition, although the discussion herein focuses largely on the touchsurfaces as being atop rigid bodies that undergo rigid body motion, some embodiments may comprise touchsurfaces atop pliant bodies that deform. "Rigid body motion" is used herein to indicate motion dominated by translation or rotation of the entire body, where the deformation of the body is negligible. Thus, the change in distance between any two given points of the touchsurface is much smaller than an associated amount of translation or rotation of the body.

Also, in various implementations, pressable touchsurfaces may comprise opaque portions that block light passage, translucent or transparent portions that allow light passage, or both.

Figure 1:
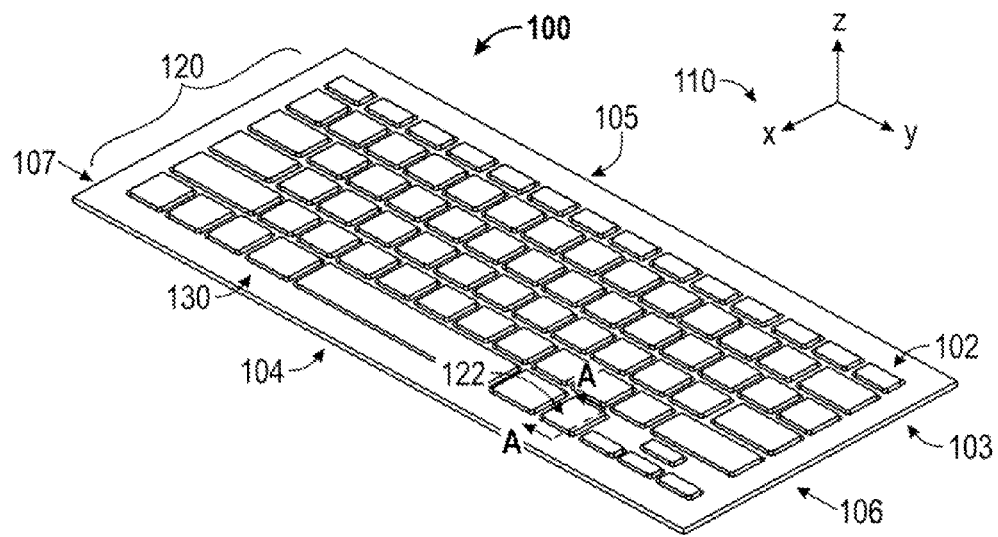
FIG. 1 shows an example keyboard that incorporates one or more implementations of key-based touchsurfaces configured in accordance with the techniques described herein.

FIG. 1 shows an exemplary keyboard 100 that incorporates a plurality of (two or more) pressable key-based touchsurfaces configured in accordance with the techniques described herein. The exemplary keyboard 100 comprises rows of keys 120 of varying sizes surrounded by a keyboard bezel 130. Keyboard 100 has a QWERTY layout, even though the keys 120 are not thus labeled in FIG. 1. Other keyboard embodiments may comprise different physical key shapes, key sizes, key locations or orientations, or different key layouts such as DVORAK layouts or layouts designed for use with special applications or non-English languages. In some embodiments, the keys 120 comprise keycaps that are rigid bodies, such as rigid rectangular bodies having greater width and breadth than depth (depth being in the Z direction explained below). Also, other keyboard embodiments may comprise a single pressable key-based touchsurface configured in accordance with the techniques described herein, such that the other keys of these other keyboard embodiments are configured with other techniques.

Orientation terminology is introduced here in connection with FIG. 1, but is generally applicable to the other discussions herein and the other figures unless noted otherwise. This terminology introduction also includes directions associated with an arbitrary Cartesian coordinate system. The arrows 110 indicate the positive directions of the Cartesian coordinate system, but do not indicate an origin for the coordinate system. Definition of the origin will not be needed to appreciate the technology discussed herein.

The face of keyboard 100 including the exposed touchsurfaces configured to be pressed by users is referred to as the "top" 102 of the keyboard 100 herein. Using the Cartesian coordinate directions indicated by the arrows 110, the top 102 of the keyboard 100 is in the positive-Z direction relative to the bottom 103 of the keyboard 100. The part of the keyboard 100 that is typically closer to the body of a user when the keyboard 100 is in use atop a table top is referred to as the "front" 104 of the keyboard 100. In a QWERTY layout, the front 104 of the keyboard 100 is closer to the space bar and further from the alphanumeric keys. Using the Cartesian coordinate directions indicated by the arrows 110, the front 104 of the keyboard 100 is in the positive-X direction relative to the back 105 of the keyboard 100. In a typical use orientation where the top 102 of the keyboard 100 is facing upwards and the front 104 of the keyboard 100 is facing towards the user, the "right side" 106 of the keyboard 100 is to the right of a user. Using the Cartesian coordinate directions indicated by the arrows 110, the right side 106 of the keyboard 100 is in the positive-Y direction relative to the "left side" 107 of the keyboard 100. With the top 102, front 104, and right side 106 thus defined, the "bottom" 103, "back" 105, and "left side" 107 of the keyboard 100 are also defined.

Using this terminology, the press direction for the keyboard 100 is in the negative-Z direction, or vertically downwards toward the bottom of the keyboard 100. The X and Y directions are orthogonal to each other and to the press direction. Combinations of the X and Y directions can define an infinite number of additional lateral directions orthogonal to the press direction. Thus, example lateral directions include the X direction (positive and negative), the Y direction (positive and negative), and combination lateral directions with components in both the X and Y directions but not the Z direction. Motion components in any of these lateral directions is sometimes referred herein as "planar," since such lateral motion components can be considered to be in a plane orthogonal to the press direction.

Some or all of the keys of the keyboard 100 are configured to move between respective unpressed and pressed positions that are spaced in the press direction and in a lateral direction orthogonal to the press direction. That is, the touchsurfaces of these keys exhibit motion having components in the negative Z-direction and in a lateral direction. In the examples described herein, the lateral component is usually in the positive X-direction or in the negative X-direction for ease of understanding. However, in various embodiments, and with reorientation of select key elements as appropriate, the lateral separation between the unpressed and the pressed positions may be solely in the positive or negative X-direction, solely in the positive or negative Y-direction, or in a combination with components in both the X and Y directions.

Thus, these keys of the keyboard 100 can be described as exhibiting "diagonal" motion from the unpressed to the pressed position. This diagonal motion is a motion including both a "Z" (or vertical) translation component and a lateral (or planar) translation component. Since this planar translation occurs with the vertical travel of the touchsurface, it may be called "planar translational responsiveness to vertical travel" of the touchsurface, or "vertical-lateral travel."

Some embodiments of the keyboard 100 comprise keyboards with leveled keys that remain, when pressed during normal use, substantially level in orientation through their respective vertical-lateral travels. That is, the keycaps of these leveled keys (and thus the touchsurfaces of these keys) exhibit little or no rotation along any axes in response to presses that occur during normal use. Thus, there is little or no roll, pitch, and yaw of the keycap and the associated touchsurfaces remain relatively level and substantially in the same orientation during their motion from the unpressed position to the pressed position.

In various embodiments, the lateral motion associated with the vertical-lateral travel can improve the tactile feel of the key by increasing the total key travel for a given amount of vertical travel in the press direction. In various embodiments, the vertical-lateral travel also enhances tactile feel by imparting to users the perception that the touchsurface has travelled a larger vertical distance than actually travelled. For example, the lateral component of vertical-lateral travel may apply tangential friction forces to the skin of a finger pad in contact with the touchsurface, and cause deformation of the skin and finger pad that the user perceives as additional vertical travel. This then creates a tactile illusion of greater vertical travel. In some embodiments, returning the key from the pressed to the unpressed position on the return stroke also involves simulating greater vertical travel using lateral motion.

To enable the keys 120 of the keyboard 100 with vertical-lateral travel, the keys 120 are parts of key assemblies each comprising mechanisms for effecting planar translation, readying the key 120 by holding the associated keycap in the unpressed position, and returning the key 120 to the unpressed position. Some embodiments further comprise mechanisms for leveling keycaps. Some embodiments achieve these functions with a separate mechanism for each function, while some embodiments achieve two or more of these functions using a same mechanism. For example, a "biasing" mechanism may provide the readying function, the returning function, or both the readying and returning functions. Mechanisms which provide both readying and returning functions are referred to herein as "ready/return" mechanisms. As another example, a leveling/planar-translation-effecting mechanisms may level and effect planar translation. As further examples, other combinations of functions may be provided by a same mechanism.

The keyboard 100 may use any appropriate technology for detecting presses of the keys of the keyboard 100. For example, the keyboard 100 may employ a key switch matrix based on conventional resistive membrane switch technology. The key switch matrix may be located under the keys 120 and configured to generate a signal to indicate a key press when a key 120 is pressed. Alternatively, the exemplary keyboard 100 may employ other key press detection technology to detect any changes associated with the fine or gross change in position or motion of a key 120. Example key press detection technologies include various capacitive, resistive, inductive, magnetic, force or pressure, linear or angular strain or displacement, temperature, aural, ultrasonic, optical, and other suitable techniques. With many of these technologies, one or more preset or variable thresholds may be defined for identifying presses and releases.

As a specific example, capacitive sensor electrodes may be disposed under the touchsurfaces, and detect changes in capacitance resulting from changes in press states of touch-surfaces. The capacitive sensor electrodes may utilize "self capacitance" (or "absolute capacitance") sensing methods based on changes in the capacitive coupling between the sensor electrodes and the touchsurface. In some embodiments, the touchsurface is conductive in part or in whole, or a conductive element is attached to the touchsurface, and held at a constant voltage such as system ground. A change in location of the touchsurface alters the electric field near the sensor electrodes below the touchsurface, thus changing the measured capacitive coupling. In one implementation, an absolute capacitance sensing method operates with a capacitive sensor electrode underlying a touchsurface, modulates that sensor electrodes with respect to a reference voltage (e.g., system ground), and detects the capacitive coupling between that sensor electrode and the touchsurface for gauging the press state of the touchsurface.

Some capacitive implementations utilize "mutual capacitance" (or "transcapacitance") sensing methods based on changes in the capacitive coupling between sensor electrodes. In various embodiments, the proximity of a touchsurface near the sensor electrodes alters the electric field between the sensor electrodes, thus changing the measured capacitive coupling. The touchsurface may be a conductive or non-conductive, electrically driven or floating, as long as its motion causes measurable change in the capacitive coupling between sensor electrodes. In some implementations, a transcapacitive sensing method operates by detecting the capacitive coupling between one or more transmitter sensor electrodes (also "transmitters") and one or more receiver sensor electrodes (also "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive.

In one implementation, a trans-capacitance sensing method operates with two capacitive sensor electrodes underlying a component having the touchsurface, one transmitter and one receiver. The resulting signal received by the receiver is affected by the transmitter signal and the location of the component having the touchsurface.

In some embodiments, the sensor system used to detect touchsurface presses may also detect pre-presses. For example, a capacitive sensor system may also be able to detect a user lightly touching a touchsurface, and distinguish that from the press of the touchsurface. Such a system can support multi-stage touchsurface input, which can respond differently to light touch and press.

Some embodiments are configured to gauge the amount of force being applied on the touchsurface from the effect that the force has on the sensor signals. That is, the amount of depression of the touchsurface is correlated with one or more particular sensor readings, such that the amount of press force can be determined from the sensor reading(s).

In some embodiments, substrates used for sensing are also used to provide backlighting associated with the touchsurfaces. As a specific example, in some embodiments utilizing capacitive sensors underlying the touchsurface, the capacitive sensor electrodes are disposed on a transparent or translucent circuit substrate such as polyethylene terephthalate (PET), another polymer, or glass. Some of those embodiments use the circuit substrate as part of a light guide system for backlighting symbols viewable through the touchsurfaces.

FIG. 1 also shows a section line A-A' relative to the key 122 of the keyboard 100, which will be discussed below.

The keyboard 100 may be integrated into a laptop computer comprising one or more processing systems formed from one or more ICs (integrated circuits) having appropriate processor-executable instructions for responding to key presses. These instructions direct the appropriate IC(s) to operate keyboard sensors to determine if a key has been pressed (or the extent of the press), and provide an indication of press status to a main CPU of the laptop or a response to the press status to a user of the laptop.

While the orientation terminology, vertical-lateral travel, sensing technology, and implementation options discussed here focuses on the keyboard 100, these discussions are readily analogized to other touchsurfaces and devices described herein.

Figure 2:
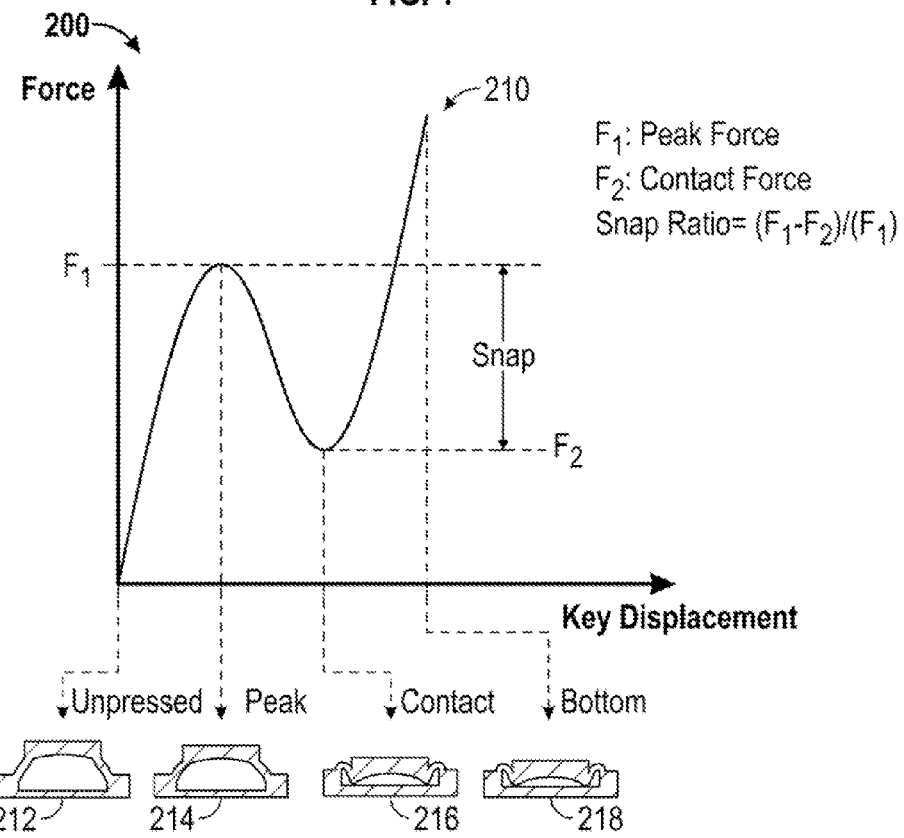
FIG. 2 is a graph of an example tactile response that is characteristic of many keys enabled with metal snap domes or rubber domes.

Various embodiments in accordance with the techniques described herein, including embodiments without metal snap domes or rubber domes, provide force response curves similar to the curve 210 of FIG. 2. Many tactile keyboard key embodiments utilize snap ratios no less than 0.4 and no more than 0.6. Other tactile keyboard key embodiments may use snap ratios outside of these ranges, such as no less than 0.3 and no more than 0.5, and no less than 0.5 and no more than 0.7.

Other embodiments provide other response curves having other shapes, including those with force and key travel relationships that are linear or nonlinear. Example nonlinear relationships include those which are piecewise linear, which contain linear and nonlinear sections, or which have constantly varying slopes. The force response curves may also be non-monotonic, monotonic, or strictly monotonic.

For example, the keys 120 made in accordance with the techniques described herein may be configured to provide the response shown by curve 210, or any appropriate response curve. The reaction force applied to a user may increase linearly or nonlinearly relative to an amount of total key travel, an amount of key travel the press direction, or an amount of key travel in a lateral direction. As a specific example, the force applied may increase with a constant slope relative to the amount of key travel for up to a first amount of force or key movement relative to its unpressed position, and then plateau (with constant force) or decrease for up to a second amount of force or key movement.

Figure 3A:
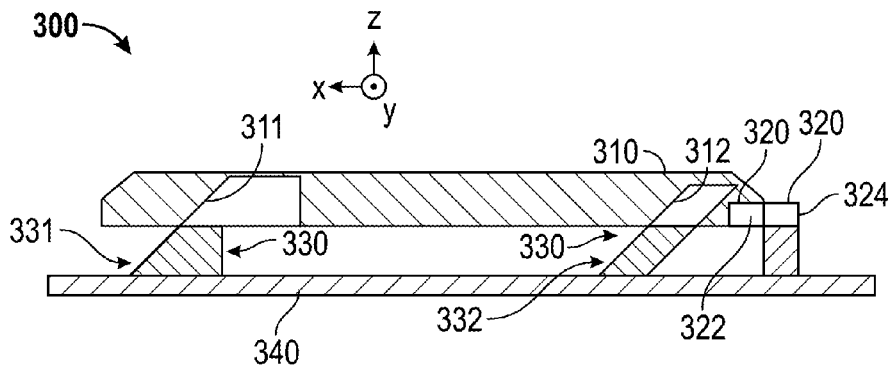
FIGS. 3A-3B are simplified side views of a first example touchsurface assembly configured in accordance with the techniques described herein.
Figure 3B:
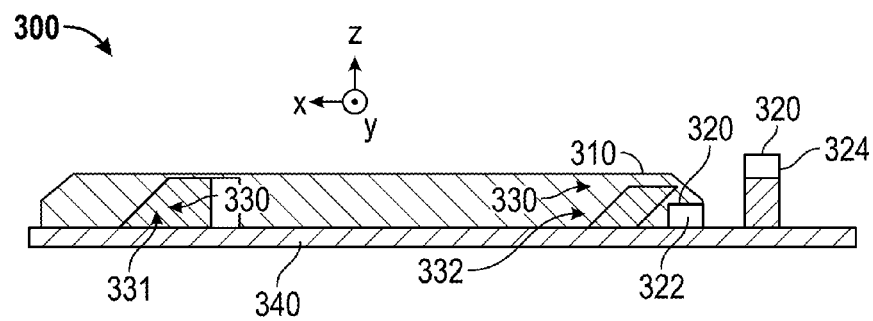

FIGS. 3A-3B are simplified cross-sectional views of a first example touchsurface assembly. The key assembly 300 may be used to implement various keys, including the key 122 of the keyboard 100. In the embodiment where FIGS. 3A-3B depict the key 122, these figures illustrate A-A' sectional views of the key 122. FIG. 3A shows the exemplary key assembly 300 in an unpressed position and FIG. 3B shows the same key assembly 300 in a pressed position. The key assembly 300 may also be used in other devices utilizing keys, including keyboards other than the keyboard 100 and any other appropriate key-using device. Further, assemblies analogous to the key assembly 300 may be used to enable non-key touchsurface assemblies such as buttons, opaque touchpads, touchscreens, or any of the touch-enabled systems described herein The key assembly 300 includes a keycap 310 that is visible to users and configured to be pressed by users, a ready/return mechanism 320, and a base 340. The unpressed and pressed positions of the keycap 310 are spaced in a press direction and in a first lateral direction orthogonal to the press direction. The press direction is analogous to the key motion found in conventional keyboards lacking lateral key motion, is in the negative-Z direction, and is the primary direction of press and key motion. In many keyboards the press direction is orthogonal to the touchsurface of the keycap or the base of the key, such that users would consider the press direction to be downwards toward the base.

The components of the key assembly 300 may be made from any appropriate material, including plastics such as polycarbonate (PC), acrylonitrile butadiene styrene (ABS), nylon, and acetal, metals such as steel and aluminum, elastomers such as rubber, and various other materials. In various embodiments, the keycap 310 is configured to be substantially rigid, such that the touchsurface of the keycap 310 appears to unaided human senses to move with rigid body motion between its unpressed and pressed positions during normal operation.

The ready/return mechanism 320 is a type of "biasing mechanism" that provides both readying and returning functions. The ready/return mechanism 320 physically biases the keycap 310 during at least part of the key press operation. It should be noted that a mechanism which only provides readying or returning function may also be termed a "biasing mechanism," if it biases the keycap 310 during at least part of the key press operation. The ready/return mechanism 320 is configured to hold the keycap 310 in its unpressed position so that the keycap 310 is ready to be pressed by a user. In addition, the ready/return mechanism 320 is also configured to return the keycap 310 partially or entirely to the unpressed position in response to a release of the press force to keycap 310. The release of the press force may be a removal of the press force, or a sufficient reduction of press force such that the key assembly is able to return the keycap 310 to the unpressed position as a matter of normal operation. In the exemplary embodiment of FIG. 3, the key assembly 300 utilizes magnetically coupled components 322, 324 to form the ready/return mechanism 320. Magnetically coupled components 322, 324 may both comprise magnets, or one may comprise a magnet while the other comprise a magnetically coupled material such as a ferrous material. Although magnetically coupled components 322, 324 are each shown as a single rectangular shape, either or both magnetically coupled components 322, 324 may comprise non-rectangular cross-section(s) or comprise a plurality of magnetically coupled subcomponents having the same or different cross sections. For example, magnetically coupled component 322 or 324 may comprise a magnetic, box-shaped subcomponent disposed against a central portion of a ferrous, U-shaped subcomponent.

In some implementations, the magnetically coupled component 322 is physically attached to a bezel or base proximate to the keycap 310. The magnetically coupled component 324 is physically attached to the keycap and magnetically interacts with the magnetically coupled component 322. The physical attachment of the magnetically coupled components 322, 324 may be direct or indirect (indirectly via one or more intermediate components), and may be accomplished by press fits, adhesives, or any other technique or combination of techniques. The amount of press force needed on the keycap to overcome the magnetic coupling (e.g., overpower the magnetic attraction or repulsion) can be customized based upon the size, type, shape, and positions of the magnetically coupling components 322, 324 involved.

The key assembly 300 comprises a planar-translation-effecting (PTE) mechanism 330 configured to impart planar translation to the keycap 310 when it moves between the unpressed and pressed positions, such that a nonzero component of lateral motion occurs. The PTE mechanism 330 is formed from parts of the keycap 310 and the base 340, and comprises four ramps (two ramps 331, 332 are visible in FIGS. 3A-B) disposed on the base 340. These four ramps are located such that they are proximate to the corners of the keycap 310 when the key assembly 300 is assembled. In the embodiment shown in FIGS. 3A-B, these four ramps (including ramps 331, 332) are simple, sloped planar ramps located at an angle to the base 340. These four ramps (including ramps 331, 332) are configured to physically contact corresponding ramp contacting features (two ramp contacting features 311, 312 are visible in FIGS. 3A-B) disposed on the underside of the keycap 310. The ramp contacting features of the keycap 310 may be any appropriate shape, including ramps matched to those of the ramps on the base 340.

In response to a press force applied to the touchsurface of the keycap 310 downwards along the press direction, the ramps on the base 340 (including ramps 331, 332) provide reaction forces. These reaction forces are normal to the ramps and include lateral components that cause the keycap 310 to exhibit lateral motion. The ramps and some retention or alignment features that mate with other features in the bezel or other appropriate component (not shown) help retain and level the keycap 310. That is, they keep the keycap 310 from separating from the ramps and in substantially the same orientation when travelling from the unpressed to the pressed position.

As shown by FIGS. 3A-B, the keycap 310 moves in the press direction (negative Z-direction) in response to a sufficiently large press force applied to the top of the keycap 310. As a result, the keycap 310 moves in a lateral direction (in the positive X-direction) and in the press direction (in the negative Z-direction) due to the reaction forces associated with the ramps. The ramp contacting features (e.g., 311, 312) of the keycap 310 ride on the ramps of the base 340 (e.g., 331, 332) as the keycap 310 moves from the unpressed to the pressed position. This motion of the keycap 310 moves the magnetically coupled components 322, 324 relative to each other, and changes their magnetic interactions.

FIG. 3B shows the keycap 310 in the pressed position. For the key assembly 300, the keycap 310 has moved to the pressed position when it directly or indirectly contacts the base 340 or has moved far enough to be sensed as a key press. FIG. 3A-B do not illustrate the sensor(s) used to detect the press state of the keycap 310, and such sensor(s) may be based on any appropriate technology, as discussed above.

When the press force is released, the ready/return mechanism 320 returns the keycap 310 to its unpressed position. The attractive forces between the magnetically coupled components 322, 324 pull the keycap 310 back up the ramps (including the ramps 331, 322), toward the unpressed position.

Many embodiments using magnetic forces utilize permanent magnets. Example permanent magnets include, in order of strongest magnetic strength to the weakest: neodymium iron boron, samarium cobalt, alnico, and ceramic. Neodymium-based magnets are rare earth magnets, and are very strong magnets made from alloys of rare earth elements. Alternative implementations include other rare earth magnets, non-rare earth permanent magnets, and electromagnets.

Although the key assembly 300 utilizes magnetically coupled components to form its ready/return mechanism 320, various other techniques can be used instead or in addition to such magnetic techniques in other embodiments. In addition, separate mechanisms may be used to accomplish the readying and returning functions separately. For example, one or more mechanisms may retain the keycap in its ready position and one or more other mechanisms may return the keycap to its ready position. Examples of other readying, returning, or ready/return mechanisms include buckling elastomeric structures, snapping metallic domes, deflecting plastic or metal springs, stretching elastic bands, bending cantilever beams, and the like. In addition, in some embodiments, the ready/return mechanism push (instead of pull) the keycap 310 to resist keycap motion to the pressed position or to return it to the unpressed position. Such embodiments may use magnetic repulsion or any other appropriate technique imparting push forces.

Many variations of or additions to the components of the key assembly 300 are possible. For example, other embodiments may include fewer or more components. As a specific example, another key assembly may incorporate any number of additional aesthetic or functional components. Some embodiments include bezels that provide functions such as hiding some of the key assembly from view, protecting the other components of the key assembly, helping to retain or guide the touchsurface of the key assembly, or some other function.

As another example, other embodiments may comprise different keycaps, readying mechanisms, returning mechanisms, PTE mechanisms, leveling mechanisms, or bases. As a specific example, the keycap 310, the base 340, or another component that is not shown may comprise protrusions, depressions, or other features that help guide or retain the keycap 310. As another specific example, some embodiments use non-ramp techniques in place or (or in addition to) ramps to effect planar translation. Examples other PTE mechanisms include various linkage systems, cams, pegs and slots, bearing surfaces, and other motion alignment features.

As yet another example, although the PTE mechanism 330 is shown in FIGS. 3A-B as having ramps disposed on the base 340 and ramp contacting features disposed on the keycap 310, other embodiments may have one or more ramps disposed on the keycap 310 and ramp contacting features disposed on the base 340. Also, the PTE mechanism 330 is shown in FIGS. 3A-B as having ramps 331, 332 with simple, sloped plane ramp profiles. However, in various embodiments, the PTE mechanism 330 may utilize other profiles, including those with linear, piece-wiselinear, or nonlinear sections, those having simple or complex curves or surfaces, or those including various convex and concave features. Similarly, the ramp contacting features on the keycap 310 may be simple or complex, and may comprise linear, piecewise linear, or nonlinear sections. As some specific examples, the ramp contacting features may comprise simple ramps, parts of spheres, sections of cylinders, and the like. Further, the ramp contacting features on the keycap 310 may make point, line, or surface contact the ramps on the base 340 (including ramps 331, 332). "Ramp profile" is used herein to indicate the contour of the surfaces of any ramps used for the PTE mechanisms. In some embodiments, a single keyboard may employ a plurality of different ramp profiles in order to provide different tactile responses for different keys.

As a further example, embodiments which level their touchsurfaces may use various leveling techniques which use none, part, or all of the associate PTE mechanism.

Figure 4:
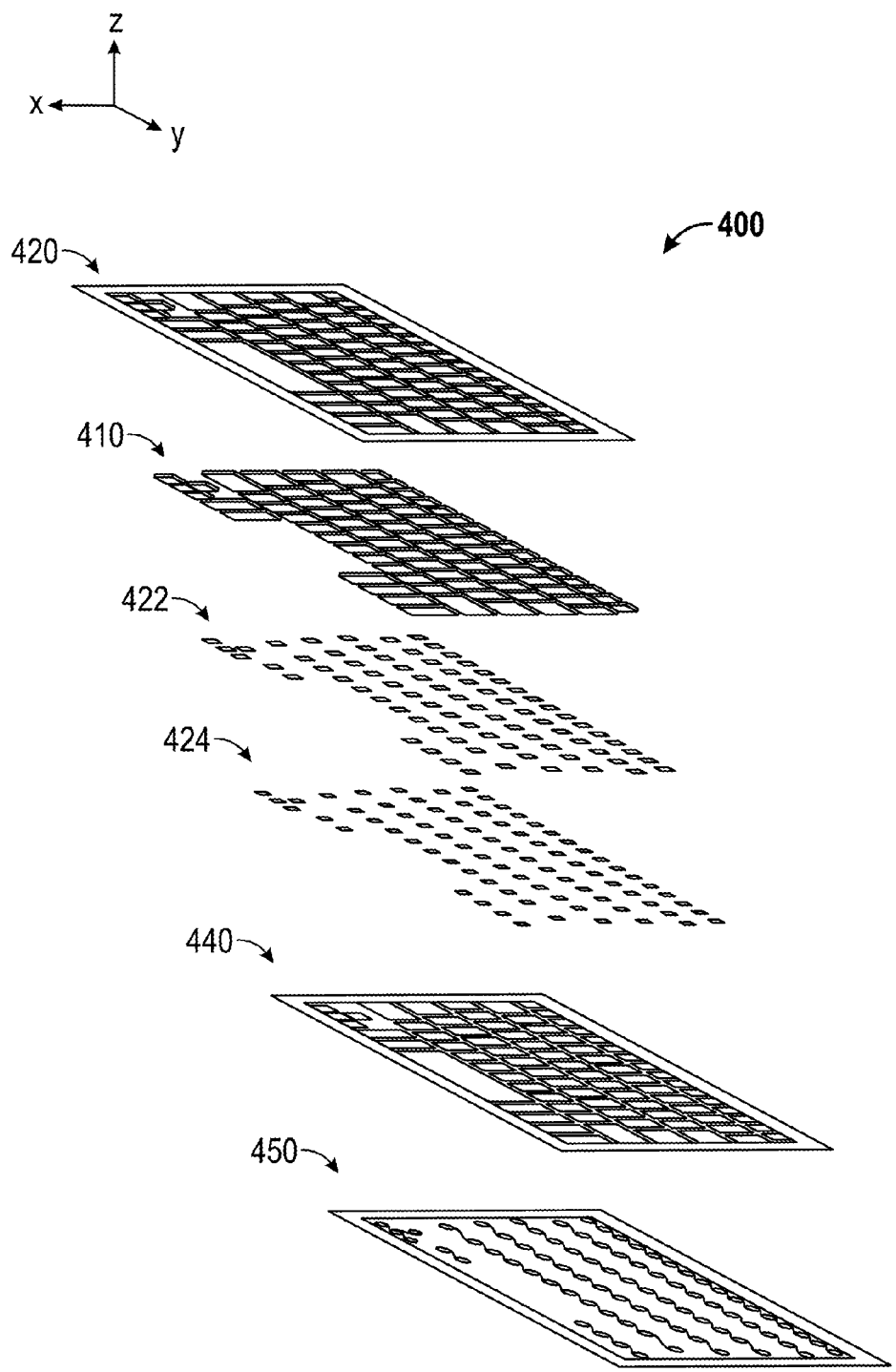
FIG. 4 shows an exploded view of an example keyboard in accordance with the techniques described herein

FIG. 4 shows an exploded view of an exemplary keyboard construction 400 in accordance with the techniques described herein. A construction like the keyboard construction 400 may be used to implement any number of different keyboards, including keyboard 100. Proceeding from the top to the bottom of the keyboard, the bezel 420 comprises a plurality of apertures through which keycaps 410 of various sizes are accessible in the final assembly. Magnetically coupled components 422, 424 are attached to the keycaps 410 or the base 440, respectively. The base 440 comprises a plurality of PTE mechanisms (illustrated as simple rectangles on the base 440) configured to guide the motion of the keycaps 410. Underneath the base 440 is a key sensor 450, which comprises one or more layers of circuitry disposed on one or more substrates.

Various details have been simplified for ease of understanding. For example, adhesives that may be used to bond components together are not shown. Also, various embodiments may have more or fewer components than shown in keyboard construction 400, or the components may be in a different order. For example, the base and the key sensor 450 may be combined into one component, or swapped in the stack-up order.

Figure 5A:
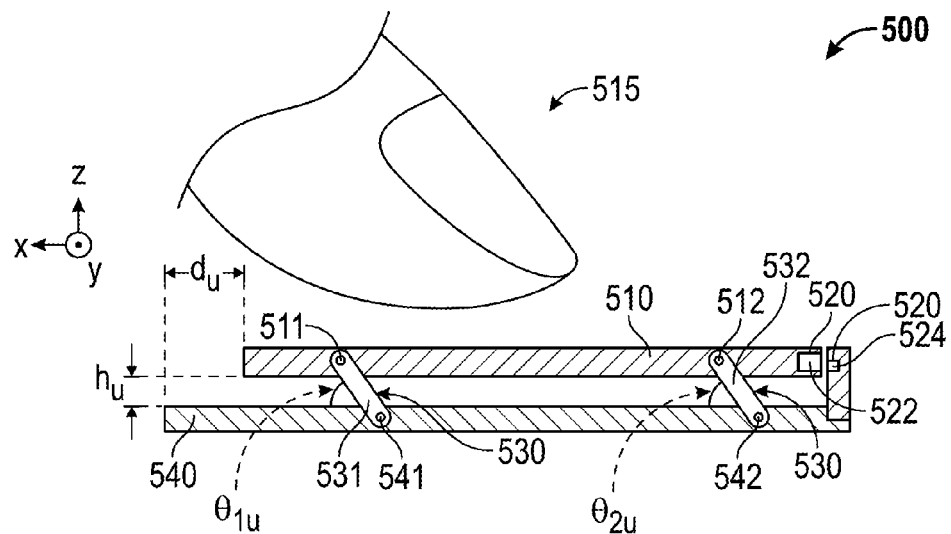
FIGS. 5A-5B are simplified side views of a second example touchsurface assembly configured in accordance with the techniques described herein.
Figure 5B:
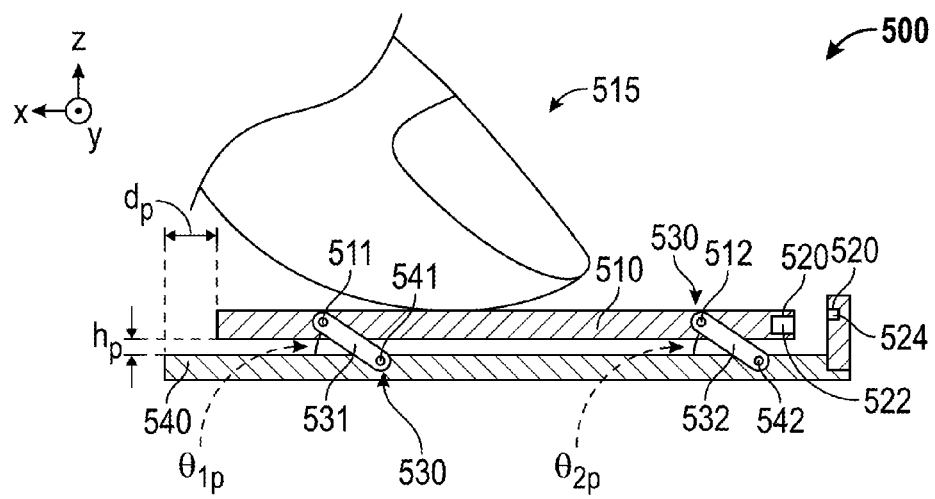

FIGS. 5A-B illustrate simplified cross-sectional views of another embodiment of a touchsurface assembly. Specifically, FIGS. 5A-B show a key assembly 500 that may be used to implement the key 122 of the keyboard 100, and illustrate A-A' sectional views of the key 122. A finger 515 is also shown to help convey orientation. FIG. 5A shows the key assembly 500 in an unpressed position and FIG. 5B shows the same key assembly 500 in a pressed position. The key assembly 500 may also be used in other devices utilizing keys, including keyboards other than the keyboard 100 and any other appropriate key-using device. Further, assemblies analogous to the key assembly 500 may be used to enable non-key, pressable touchsurface assemblies such as buttons, opaque touchpads, touchscreens, or any of the touch-enabled systems described herein.

The key assembly 500 comprises a keycap 510 that is visible to users and configured to be pressed by users, a ready/return mechanism 520, and a base 540. The ready/return mechanism 520 comprises magnetically coupled components 522, 524. The keycap 510, ready/return mechanism 520, and base 540 of the key assembly 500 are similar to the keycap 310, ready/return mechanism 320, and base 340 of the key assembly 300. Thus, the descriptions of these components of the key assembly 300 and associate variations and alternatives can be readily applied to these analogous structures of the key assembly 500. As an example application of the discussion of key assembly 300 to the key assembly 500, the ready/return mechanism 520 may be termed a biasing mechanism, and it is configured to bias the keycap 510 away from the base 540. Also, the magnetically coupled components 522, 524 enable the ready/return mechanism 520 to use magnetic forces to bias the keycap 510. In response to press force applied to the keycap 510, the ready/return mechanism 520 resists keycap movement toward the pressed position. And, in response to a removal of the press force, the ready/return mechanism 520 biases the keycap 510 toward the unpressed position. Further, any number of variations of the ready/return mechanism 520 are possible, including any of the ones discussed in conjunction with the ready/return mechanism 320.

Some embodiments of the key assembly 500 also include a PTE mechanism 530 that differs from that of the key assembly 330. The PTE mechanism 530 is based on linkages instead of ramps. The PTE mechanism 530 comprises a first linkage 531 rotatably coupled to the base 540 and the keycap 510, and a second linkage 532 rotatably coupled to the base 540 and the keycap 510. The rotatable coupling may be accomplished in any number of ways. The specific depiction in FIGS. 5A-B shows no intermediate components or complex joints. It illustrates the first linkage 531 as comprising a first base coupling portion rotatably coupled to the base 540 at a first base revolute joint 541 and a first keycap coupling portion rotatably coupled to the keycap 510 at a first keycap revolute joint 511. It also illustrates the second linkage 532 as comprising a second base coupling portion rotatably coupled to the base 540 at a second base revolute joint 542 and a second keycap coupling portion rotatably coupled to the keycap 510 at a second keycap revolute joint 512. In other embodiments, the first or second linkage 531 or 532 has linear shapes, or the first or second linkage 531 or 532 is not in direct contact with the base 540 or keycap 510, and is indirectly coupled through one or more intermediate components. Together, the keycap 510, first and second linkages 541, and the base 540 form a linkage system that defines the translational and rotational motion allowed of the keycap 510.

As shown in FIG. 5A, in the unpressed position, the linkage 531 forms a first angle $\theta_{1u}$ with the base 540, and the second linkage 532 forms a second angle $\theta_{2u}$ with the base 540. The first angle $\theta_{1u}$ is the angle formed by the base 540 with a line connecting the first keycap revolute joint 511 and the first base revolute joint 541. Similarly, the second angle $\theta_{2u}$ is the angle formed by the base 540 with a line connecting the second keycap revolute joint 512 and the second base revolute joint 542. Where the base 540 is not strictly planar, a best-fit plane or a plane orthogonal to the press direction (negative-Z direction) can be used.

FIG. 5A shows $\theta_{1u}$ as being substantively equal to $\theta_{2u}$, the length of the first linkage 531 being substantially equal to the length of the second linkages 532, and the distance between the first and second keycap revolute joints 511, 512 being substantially equal to the distance between the first and second base revolute joints 541, 542. The lengths of the first and second linkages 531, 532 are measured between the corresponding keycap revolute joints 511, 512 and base revolute joints 541, 542, respectively. This configuration creates a parallelogram-type linkage system, and keeps the keycap 510 level when moving between the unpressed and pressed positions. Thus, the first and second linkages together maintain the keycap 510 in a substantially constant orientation relative to the base 540 while guiding the keycap 510 toward the pressed position. The first and second linkages also guide the keycap 510 to move along an arc, such that a point on the keycap 510 traces out an arc with a radius of the length of one of the linkages. Manufacturing and assembly tolerances will often cause some amount of non-idealized response, but the keycap 510 would appear to users as not rotating about any axis and keeping the same orientation when moving between unpressed and pressed positions.

FIG. 5B shows the key assembly 500 in the pressed position, where the lengths and distances described above have not changed, but the angles between the first and second linkages 531, 532 with the base 540 have changed. As shown in FIGS. 5A-B, these pressed-keycap angles $\theta_{1p}$ and $\theta_{2p}$ are equal to each other, but are less than $\theta_{1u}$ and $\theta_{2u}$. These angles thus have changed by the amounts $(\theta_{1u}-\theta_{1p})$ and $(\theta_{2u}-\theta_{2p})$. The keycap 510 also travelled along the press direction (negative-Z direction) from the unpressed to the pressed position. Using the notation as shown in FIG. 5A-B, this vertical component of keycap 510 motion can be expressed as $(h_u-h_p)$. Similarly, using the notation as shown in FIGS. 5A-B the lateral component of keycap 510 motion from the unpressed to the pressed positions can be expressed as $(d_u-d_p)$.

Thus, the keycap 510 moves a first amount in the press direction and a second amount in a lateral direction orthogonal to the press direction. These first and second amounts may have any ratio allowed by the physical constraints of the assembly. One may be many times the other, for example. In some embodiments, the first amount in the press direction is at least as much as the second amount and no larger than twice the second amount in the lateral direction. That is, the first amount is equal or greater to the second amount, and less than or equal to twice the second amount. In some embodiments, the first amount vertically downwards in the press direction ranges from 0.5 mm to 1.4 mm, and the second amount laterally ranges from 0.25 or 0.30 mm to 0.7 mm. The specific amount of motion is defined by the specific design of the assembly. For example, the physical details of the keycap 510, linkages 531 and 532, and base 540 impose some limits on the motion. In some embodiments, features on these or other components, or additional components or mechanisms, physically limit the motion of the keycap 510.

The angles $\theta_{1u}$, $\theta_{2u}$, $\theta_{1p}$, $\theta_{2p}$ may be any angle allowed by the physical limits of the system. In some embodiments, in the unpressed position, the angle between the first or second linkage 531, 532 and the base 540 ($\theta_{1u}$, $\theta_{2u}$) are no less than forty-five (45) degrees and less than sixty-five (65) degrees. That is, one or both of $\theta_{1u}$, $\theta_{2u}$ are equal or greater to 45 degrees. In some embodiments, in the pressed position, the angle between the first or second linkage 531, 532 and the base 540 ($\theta_{1p}$, $\theta_{2p}$) are no less than negative five (−5) degrees and less than fifteen (15) degrees. That is, one or both of $\theta_{1p}$, $\theta_{2p}$ are equal or greater to −5 degrees. In many embodiments, $\theta_{1p}$, $\theta_{2p}$ are no less than zero (0) degrees. In various embodiments of the key assembly 500, the path of keycap travel and the associate displacement components in different directions may be defined by particular values of $\theta_{1u}$, $\theta_{2u}$, $\theta_{1p}$, and $\theta_{2p}$, and the distance between the revolute joints of each linkage 531, 532.

In other embodiments, one or more of the angles, lengths, or distances related to the linkages 531, 532 that are described above may differ and be unequal, such that the motion, change in angle, vertical component of travel, or lateral component of travel of the keycap 510 deviates from that described above. In some embodiments, the linkage system or other components of the key assembly 500 are configured such that the motion of a first part of the keycap 510 differs from a second part of the keycap 510. This can be accomplished in numerous ways, including by rotating of the keycap 510 about one or more axes, by introducing compliance to one or more components of the key assembly 500 such that not all parts move with rigid body motion, and the like.

FIGS. 5A-B do not show the width of the key assembly 500 (in the Y direction), and it will be appreciated that the cross section may be constant or vary through the width. For example, the magnetically coupled components 522, 524 may extend through only part of the width of the keycap 510. As another example, the width of the keycap 510 may be less than the width of the base 540. As yet another example, the cross section of linkage 531 shown in FIGS. 5A-B may extend partially or entirely through the width of the keycap 510. That is, the linkage 531 may extend a tenth or an eighth of the width of the keycap 510, and be located only on one (the left) side of the keycap 510; or, the linkage 531 may extend mostly through the width of the keycap 510. Similar options apply to the linkage 532.

Where the linkage 531 or the linkage 532 extends through only partially through the width of the keycap 510, and where linkages 531, 532 are the only parts of the PTE 530 coupled to the keycap 510 and the base 540, the keycap 510 generally has a greater likelihood of tilting. This is largely due to reduced support on one side of the keycap 510. Thus, many embodiments with linkage 531 or 532 substantially thinner than the width of the keycap 510 include one or more additional linkages (not shown) similar to the thinner linkage on the opposite (right) side of the key assembly 500, near an opposite (right) edge of the keycap 510. In embodiments where such additional linkage(s) exist, the previous discussion regarding angles, lengths, distances, and such also apply. Additional examples of linkages, including linkages which extend most of the width of their respective keycaps, are further discussed in connection with FIGS. 6-10.

In some embodiments, the key assembly 500 includes a sensor (not shown) for detecting the pressed state of the keycap 510. The sensor may use any appropriate technology, including the ones described herein. For example, one or more capacitive sensor electrodes may be disposed spaced from the keycap 510 and used to detect changes in capacitance caused by changes in position of the keycap 510 relative to the capacitive sensor electrode(s). Further, the senor may be configured to actively detect unpressed and pressed positions of the keycap 510, or to actively detect only the pressed state with the assumption that no detection of the pressed state means the keycap 510 is unpressed, or vice versa.

Additional example key assemblies and touchsurface assemblies are described in connection with FIGS. 6-8, 10. These figures omit many components that are analogs of similar components found in key assemblies 300, 500, and the discussions associated with those key assembly 300, 500 components can be analogized to these additional key or touchsurface assemblies. Examples components that may be included include sensors for detecting key presses, biasing mechanisms for providing readying, returning, or ready/return function, etc. Further, many variations and alternatives described for the key assemblies 300, 500 are also applicable to some embodiments of these different example assemblies.

Figure 6:
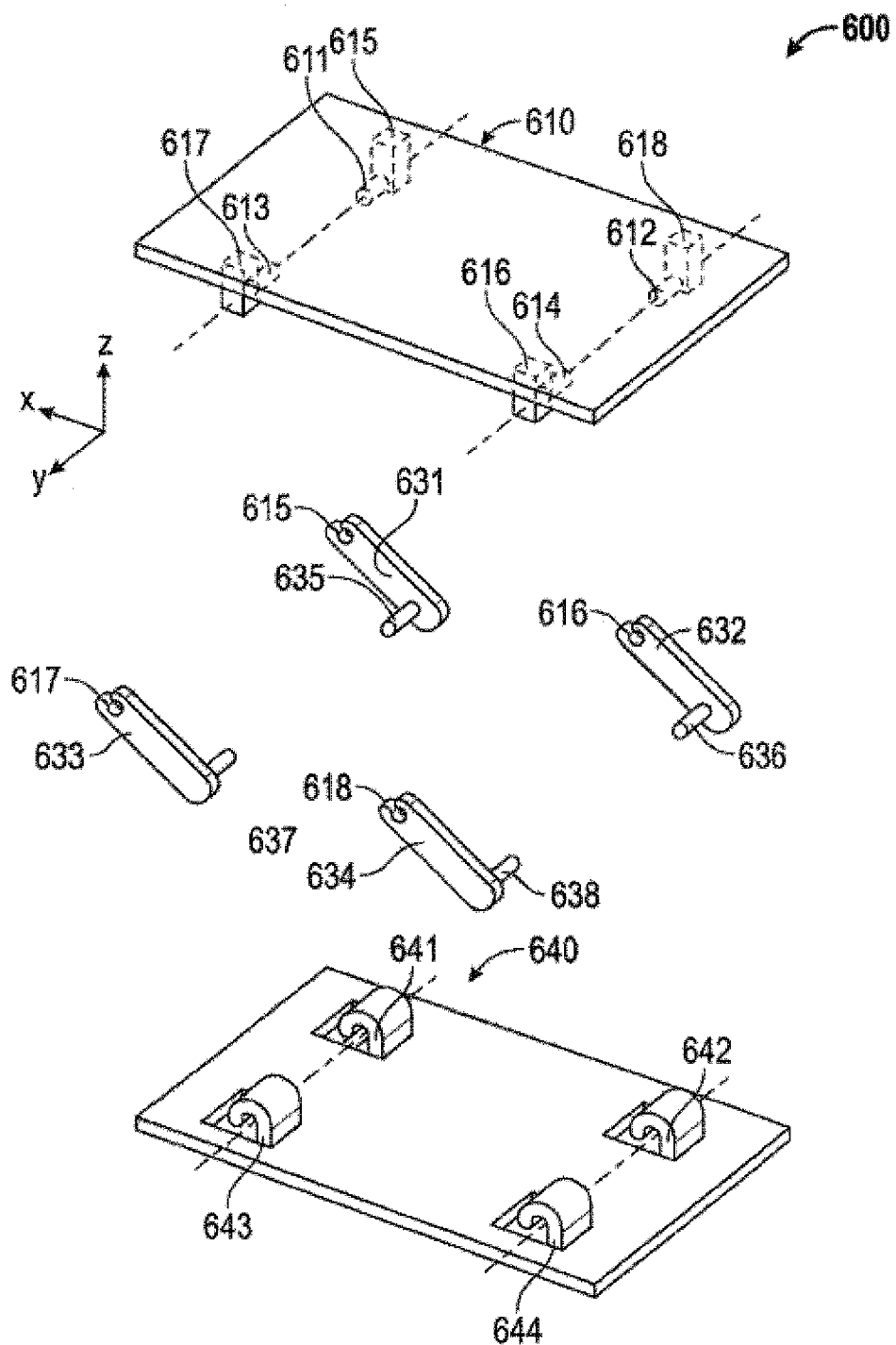
FIG. 6 shows a simplified exploded view of an exemplary touchsurface assembly in accordance with the techniques described herein.

FIG. 6 shows a simplified exploded view of an exemplary touchsurface assembly 600 in accordance with the techniques described herein. As noted above, many components have been omitted from FIG. 6 for clarity, and much of the discussions associated with key assemblies 300, 500 can be analogized to apply to parts of the touchsurface assembly 600. The touchsurface assembly 600 may be used to implement a key assembly similar to the ones described herein, or it may be used to implement non-key assemblies.

The touchsurface assembly 600 comprises a pressable cap 610, a base 640, and four linkages 631-634 that each couple to different parts of the pressable cap 610 and the base 640. Generally, the linkages 631-634 are disposed to span a footprint that covers most of the width (in the Y-direction) and length (in the X direction) of the pressable cap 610. This locates linkages 631 and 633 near opposite keycap edges located across the width of the first keycap, and linkages 632 and 634 near opposite keycap edges located across the width of the first keycap.

For the example shown in FIG. 6, any suitable process can be used to produce the components shown. However, the base 640 is suited to be produced by stamping or injection molding, the linkages 631-634 are suited to be injection molded or cast, and the pressable cap 610 is suited to be injection molded. The linkages 631-634 have extensions 635-638 that slide into bearings 641-644, respectively. The bearings 641-644 are formed in the base 640, and their coupling with the extensions 635-638, respectively, form base revolute joints. The linkages 631-634 also have snap-in depressions 615-618 configured to capture extensions 611-614, respectively, to form pressable cap revolute joints. During operation, the different parts of the touchsurface assembly 600 functions similarly to their analogs in the key assembly 500. Thus, the linkages 631-634 rotate relative to the pressable cap 610 and the base 640, and guide the pressable cap between the pressed and the unpressed positions.

Figure 7:
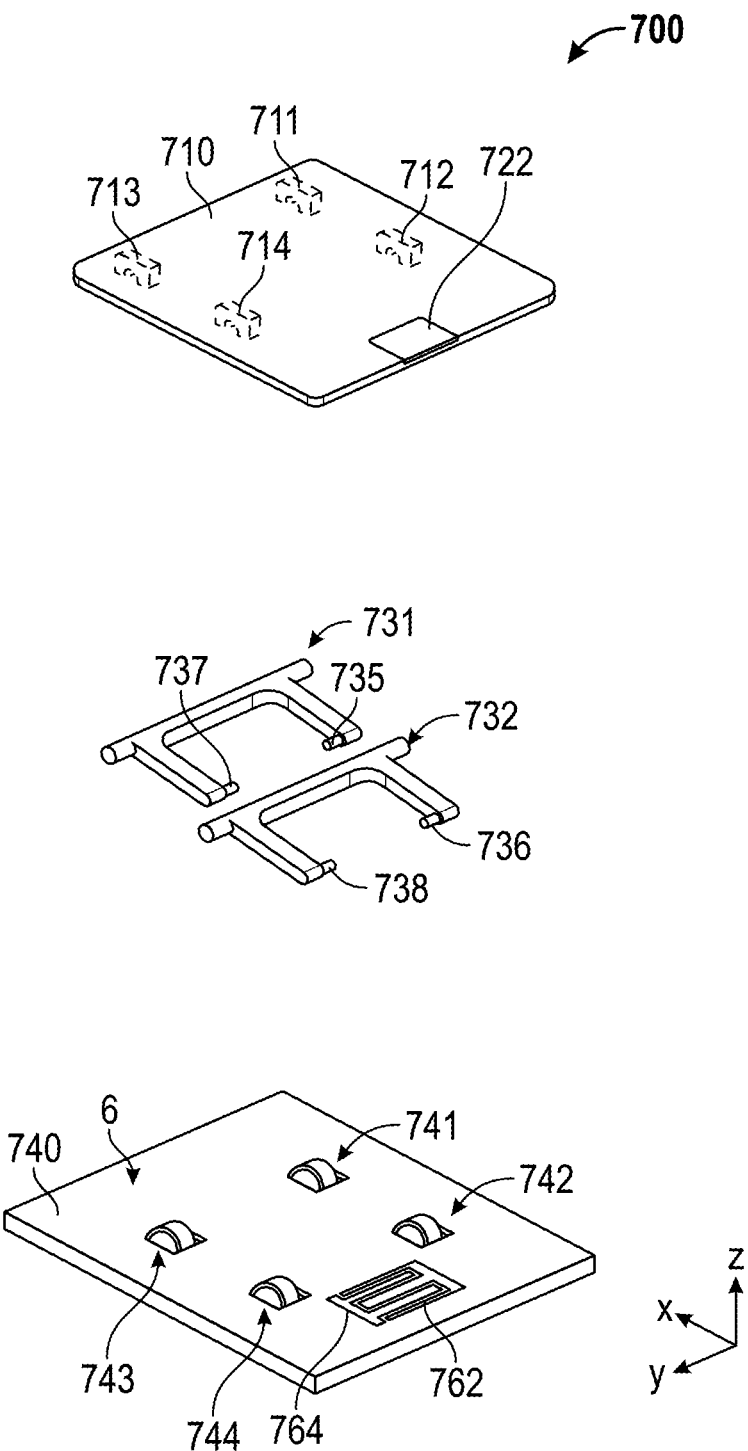
FIG. 7 shows a simplified exploded view of another exemplary touchsurface assembly in accordance with the techniques described herein.

FIG. 7 shows a simplified exploded view of another exemplary touchsurface assembly 700 in accordance with the techniques described herein. As noted above, many components have been omitted from FIG. 7 for clarity, and much of the discussions associated with key assemblies 300, 500 can be analogized to apply to parts of the touchsurface assembly 700. The touchsurface assembly 700 may be used to implement a key assembly similar to the ones described herein, or it may be used to implement non-key assemblies.

The touchsurface assembly 700 comprises a pressable cap 710, a base 740, and two 'U' shaped linkages 731, 732. Each of the linkages 731, 732 is coupled to two different parts of the pressable cap 710 and the base 740. The linkage 731 has base extensions 735, 737 that slide into bearings 741, 743, respectively. The linkage 732 has base extensions 736, 738 that slide into bearings 742, 744, respectively. This coupling of the linkages 731, 732 with the bearings 741-744 forms base revolute joints. The linkage 731 is also configured to snap-in bearings 711, 713, and the linkage 732 is also configured to snap into snap-in bearings 712 and 714. This coupling of the linkages 731, 732 with the snap-in bearings 711-714 forms keycap revolute joints. Generally, the linkages 731, 732 are disposed to span a footprint that covers most of the width and length of the pressable cap 710. Thus, parts of the linkage 731 can found near opposite keycap edges located across the width of the pressable cap 710 (and similarly for the linkage 731).

For the example shown in FIG. 7, any suitable process can be used to produce the components shown. However, the base 740 is suited to be produced by stamping, the linkages 731, 732 are suited to be injection molded, and the pressable cap 710 is suited to be injection molded.

Also shown in FIG. 7 are transcapacitive sensor electrodes 762, 764 of a capacitive sensor configured to detect the magnetically coupled component 722 attached to the pressable cap 710. As the pressable cap 710 moves between the pressed and unpressed positions, the magnetically coupled component 722 changes the capacitive coupling detected by the transcapacitive sensor electrodes 762, 764. During operation, a processing system (not shown) communicatively coupled to the transcapacitive sensor electrodes 762, 764 drives them to produce signals indicative of the capacitive coupling. This processing system or a processor further downstream determines a press state of the pressable cap 710 based on those signals. During operation, the other parts of the touchsurface assembly 700 functions similarly to their analogs in the key assembly 500.

Figure 8A:
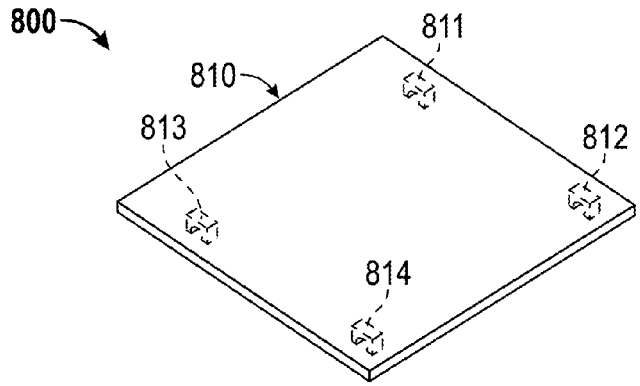
FIGS. 8A-8B show a portion of a touchsurface assembly utilizing shaped wires, in accordance with embodiments of the technology described herein.
Figure 8A:
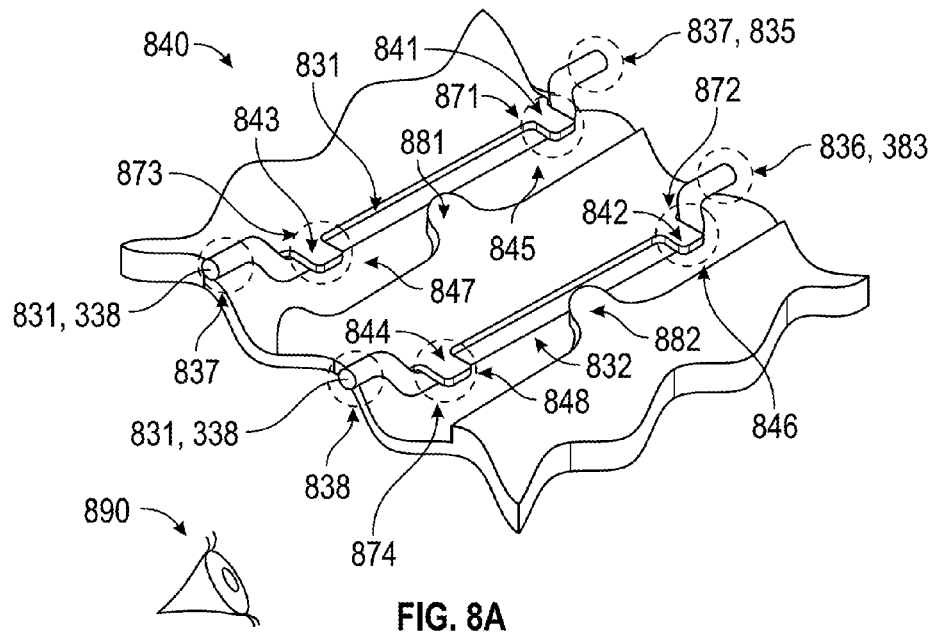
Figure 8B:
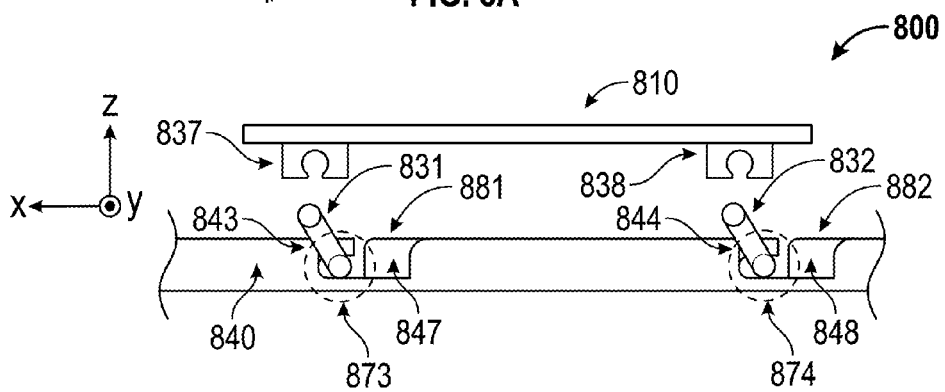

FIGS. 8A-8B show a portion of a touchsurface assembly 800 utilizing shaped wires, in accordance with embodiments of the technology described herein. FIG. 8A shows a simplified exploded view of the touchsurface assembly 800, and FIG. 8B shows a side view from the location of the eyeball 890. As noted above, many components have been omitted from FIG. 8 for clarity, and much of the discussions associated with key assemblies 300, 500 can be analogized to apply to parts of the touchsurface assembly 800. The touchsurface assembly 800 may be used to implement a key assembly similar to the ones described herein, or it may be used to implement non-key assemblies.

The touchsurface assembly 800 comprises a pressable cap 810, a base 840, and two linkages 831, 832 enabled by shaped wires. Each of the linkages 831, 832 is coupled to two different parts of the pressable cap 810 and the base 840. Generally, the linkages 831, 832 are disposed to span a footprint that covers most of the width (in the Y-direction) and length (in the X direction) of the pressable cap 810.

Portions of the linkage 831 have been slipped into undercuts under the lips 841 and 843, which retain the linkage 831 to form base revolute joints 871 and 873, respectively. These portions of the linkage 831 can be termed "base coupling portions." The lips 841 and 843 are near pockets 845 and 847 formed in the base 840. As shown in FIG. 8, the pockets 845 and 847 are contiguous with the undercuts under the lips 841 and 843, and separated by a retention feature 881. The pockets 845 and 847 to assist in the coupling of the linkage 831 with the undercuts under the lips 841 and 843, respectively, without substantially deflecting the lips 841 and 843. Thus, the lips 841, 843 and their respective undercuts and the rest of the base 840 do not substantively change in shape to accommodate the base revolute joints. The pockets 845 and 847 allow a first deformed part of the linkage 831 to be located in the pocket 845 and then slipped under the lip 841, and a second deformed part of the linkage 831 to be located in the pocket 847 and slipped under the lip 843. The retention feature 881 helps to retain the linkage 831 under the lips 841, 843, and limit translation of the linkage 831 in the X direction.

Similarly, portions of the linkage 832 have been slipped into undercuts under the lips 842 and 844 to form base revolute joints 872 and 874, respectively. These portions of the linkage 832 can also be termed "base coupling portions." The lips 842 and 844 are near pockets 846 and 848 formed in the base 840. Also similarly, the pockets 846 and 848 assist in the coupling of the linkage 832 with the undercuts under the lips 842 and 844, respectively, without substantially deflecting the lips 842 and 844. The pockets 846 and 848 allow deformed parts of the linkage 832 to be slipped under the lips 842 and 844. The retention feature 882 helps to retain the linkage 832 under the lips 842, 844, and limit translation of the linkage 832 in the X direction.

The linkages 831 further contain cap revolute portions 835 and 837, which are snapped into snap-in depressions 811 and 813, respectively, to form cap revolute joints. Similarly, the linkages 832 further contain cap revolute portions 836 and 838, which are snapped into snap-in depressions 812 and 814, respectively, to form cap revolute joints.

Many variations of the technology exemplified by the touchsurface assembly 800 are possible. For example, although touchsurface assembly 800 comprises a pressable cap 810 that contains snap-in portions 811-814, and a base 840 that contains the lips 841-844 and associated undercuts and pockets 845-848, some embodiments may locate some or all of these features on different components. As a specific example, some embodiments may comprise a pressable cap with pocket, undercut, and lip features for retaining one or more shaped wires, and a base with snap-in features for retaining the one or more shaped wires. Some embodiments may locate all of the pocket, undercut, and lip features on the pressable cap and all of the snap-in features on the base, while other embodiments may locate some of the pocket, undercut, and lip features on the pressable cap and some on the base.

Figure 9:
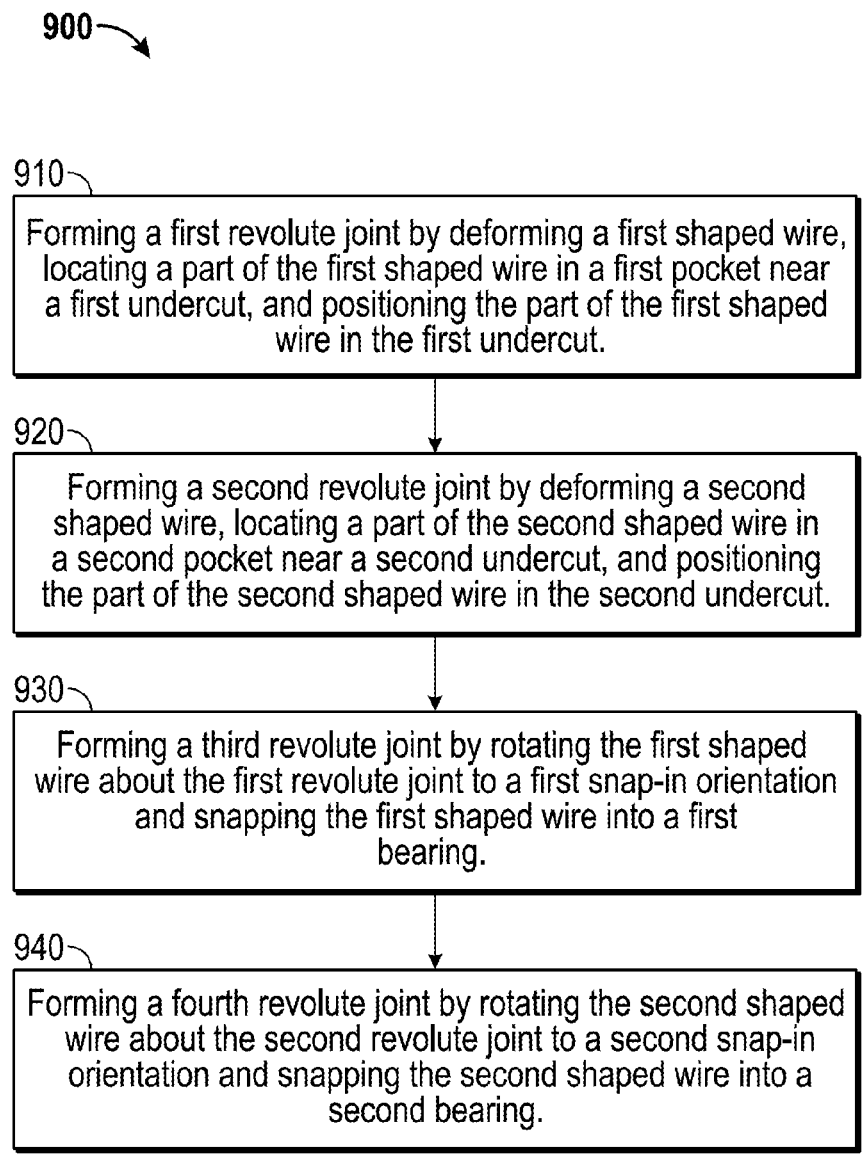
FIG. 9 shows a method for forming a touchsurface assembly with shaped wires.

FIG. 9 shows a method 900 for forming a touchsurface assembly with shaped wires such as touch assembly 800. In Step 910, a first revolute joint is formed by first deforming a first shaped wire, then locating a part of the first shaped wire in a first pocket near a first undercut, and then positioning the part of the first shaped wire in the first undercut. In Step 920, a second revolute joint is formed in a similar way. A second shaped wire is first deformed, then a part of the second shaped wire is located in a second pocket near a second undercut, and then the part of the second shaped wire is positioned in the second undercut. The positioning of the part of the first or second shaped wire can be accomplished in whole or in part by allowing the first or second shaped wire to undeform.

In step 930, a third revolute joint is formed by rotating the first shaped wire about the first revolute joint to a first snap-in orientation, and snapping the first shaped wire into a first bearing. In Step 950, a fourth revolute joint is formed by rotating the second shaped wire about the second revolute joint to a second snap-in orientation and snapping the second shaped wire into a second bearing. If the first and second shaped wires are slipped into the undercuts in steps 910 and 920 in the snap-in position, the rotation shown in steps 930 and 940 can be skipped.

Where the method 900 is used to form a key assembly-type touchsurface assembly, the steps 910, 920, 930, and 940 together couple a base to a keycap. Two of the revolute joints are located on the base, and two of the revolute joints are located on the keycap. Thus, any of the steps 910, 920, 930, and 940 can be coupling the shaped wire with a base or the keycap. In many cases, the steps 910 and 920 are performed on the same component (the base or the keycap), and the steps 930 and 940 are performed on the same component (the keycap or the base), but this may differ. For example, the steps 910 and 930 may be performed on the base (or the keycap) and the steps 920 and 940 may be performed on the keycap (or the base) where the base and the keycap each has an undercut revolute joint and a snap-in revolute joint.

The method 900 can be used to form the first shaped wire, second shaped wire, base, and keycap into a quadrilateral four-bar mechanism with four revolute joints.

Many variations of the method 900 are possible. For example, the steps may be in any appropriate order, and need not be in the order shown. As another example, fewer or additional steps may be used. As a first specific example, an additional step may be providing a biasing mechanism configured to bias the keycap away from the base. Where the biasing mechanism comprises magnetically attracted material, the biasing mechanism may use magnetic forces to bias. As a second specific example, an additional step may be providing a capacitive sensor electrode configured to detect a pressed state of the keycap. That is, one or more capacitive sensor electrodes may be manufactured or located such that they can provide signals from which a processing system can determine if the keycap is pressed. In some embodiments, the sensor electrodes may be able to provide more information, such as data about non-contact input, pre-press, a range of partial presses, and the like.

Figure 10A:
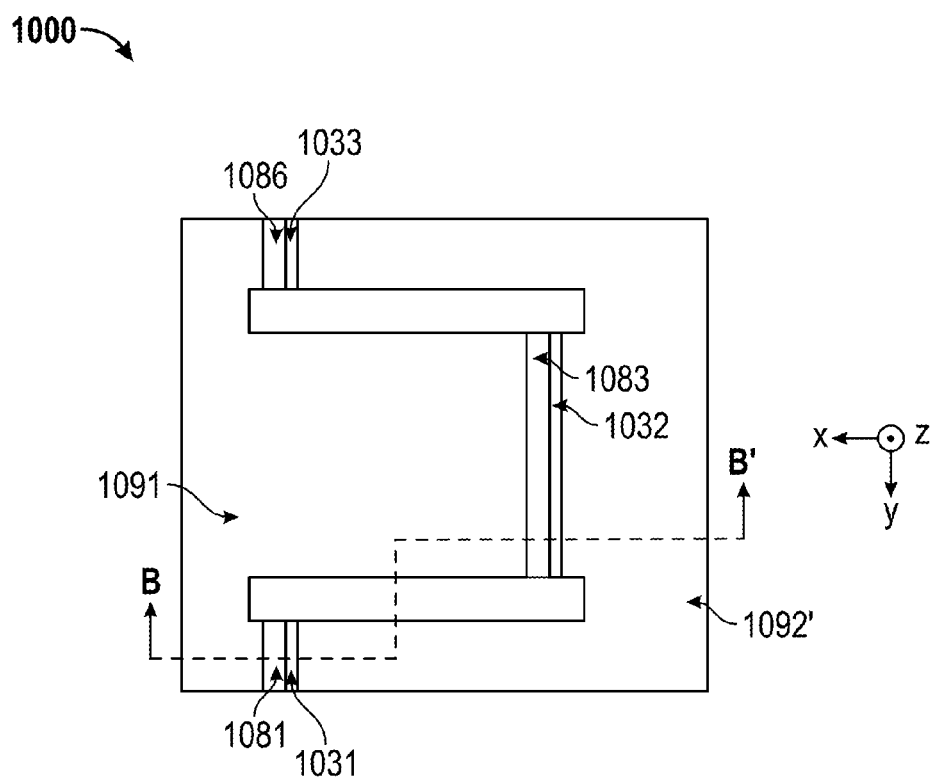
FIGS. 10A-10B show a portion of a touchsurface assembly utilizing living hinges, in accordance with embodiments of the technology described herein.
Figure 10B:
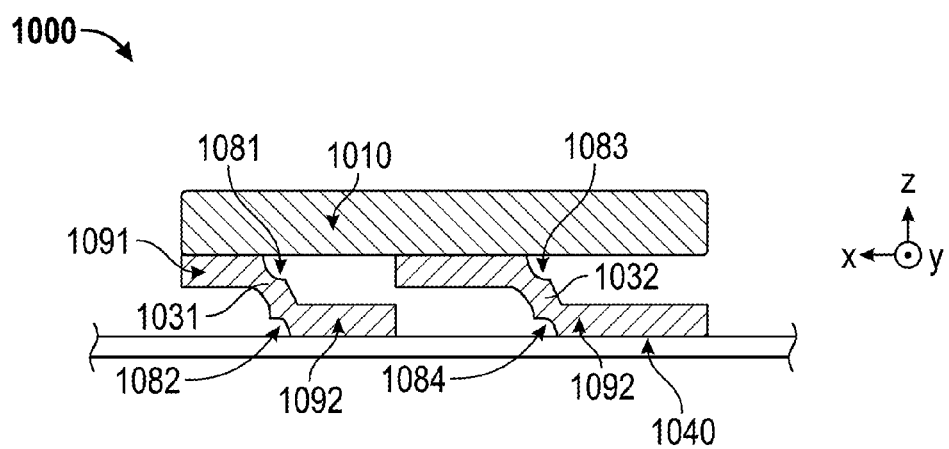

FIGS. 10A-10B show a portion of a touchsurface assembly 1000 utilizing living hinges, in accordance with embodiments of the technology described herein. FIG. 10A shows a simplified top view of the touchsurface assembly 1000, and FIG. 10B shows a simplified cross section along section line B-B'. Note that section B-B' has a singularity point, and the section actually shows cuts at two different lateral sections of the touchsurface assembly 1000. As noted above, many components have been omitted from FIG. 10 for clarity, and much of the discussions associated with key assemblies 300, 500 can be analogized to apply to parts of the touchsurface assembly 1000.

The touchsurface assembly 1000 may be used to implement a key assembly similar to the ones described herein, or it may be used to implement non-key assemblies.

The touchsurface assembly 1000 comprises a pressable cap 1010 (not shown in FIG. 10A but shown in FIG. 10B), a base 1040, and three linkages 1031, 1032, and 1033. Unlike in the embodiments shown in FIGS. 7, 8A-8B, and more similar to the embodiment shown in FIG. 6, two linkages 1031 and 1033 support one end of the pressable cap 1010. And, more like the embodiments shown in FIGS. 7, 8A-8B, and less similar to the embodiment shown in FIG. 6, one linkage 1032 support the other end of the pressable cap 1010. In some embodiments, the linkage 1032 is further split into two linkages.

The linkages 1031-1033 are each enabled by two living hinges. Linkage 1031 is associated with living hinges 1081 and 1082, linkage 1032 is associated with living hinges 1083 and 1084, and linkage 1033 is associated with living hinges 1085 and 1086 (the living hinge 1085 is located under the linkage 1033 and not visible). In the example shown in FIGS. 10A-10B, the living hinges 1801-1086 are shown implemented with reliefs, although other embodiments may have no reliefs, more reliefs, or reliefs with other profiles.

The linkages 1031-1033 are coupled through the living hinges 1081, 1083, 1085, respectively, to a cap coupling portion 1091. The linkages 1031-1033 are also coupled through the living hinges 1082, 1084, 1086, respectively, to a base coupling portion 1092. In some embodiments, and due to the design of some living hinges, the linkages 1031-1033 both rotate about and translate relative to a center of their respective living hinges 1081-1082, 1083-1084, 1085-1086. Where the translation is negligible, and where the rotation component is much greater than the translation component, the living hinge may still be referred to herein as a revolute joint in effect and the items coupled by the living hinge may still be described herein as rotatably coupled.

The base coupling portion 1092 is attached to the base 1040 by any appropriate method. For example, application of adhesives, heat staking, co-molding, clamping, riveting, press fitting, or snap fitting, are all contemplated. The cap coupling portion 1091 is attached to the pressable cap 1010, also by any appropriate method. Thus, the touchsurface assembly 1000 can be considered to have a combination-cap that comprises the pressable cap 1010 and the cap coupling portion 1091. The pressable cap 1010 is a subcomponent of the combination-cap that is configured to be seen and contacted by users. The cap coupling portion 1091 is a subcomponent attached to the pressable cap 1010 that is rotatably coupled to the linkages 1091-1093 of the touchsurface assembly 1000.

In the embodiment shown, all of the linkages 1031-1033, associated living hinges 1081-1086, and cap and base coupling portions 1091-1092 are formed from a same piece part. Thus, only one integral component comprises all of these aforementioned parts. This approach lends itself well to manufacturing processes such as injection molding, casting, or stamping. The injection molding may be of polypropylene or any other appropriate living-hinge material or material(s). Multiple materials may be injection molded or cast where more compliant materials are used for part or all of the living hinges 1081-1086 and more rigid materials are used for part or all the cap or base coupling portions 1091-1092. The stamping may be of a metal such as steel or copper, or any other appropriate living hinge material.

Many variations of the touchsurface assembly 1010 are possible. For example, some embodiments may use two or four or other numbers of linkages. As another example, some embodiments lack a base coupling portion, and the base is part of the piece part used to form the linkages.

As discussed earlier, one or more embodiments of the touchsurface assemblies described herein, such as the key assembly 500, may be incorporated in a keyboard such as the keyboard 100, in accordance with the techniques described herein. Such a keyboard may have keys or buttons enabled with other techniques alongside keys enabled by the technology described herein. For example, an example keyboard may comprise: a base, a plurality of keycaps, a plurality of biasing mechanisms, a plurality of first linkages, and a plurality of second linkages. The plurality of biasing mechanisms are configured to bias the plurality of keycaps away from the base. Each keycap of the plurality of keycaps is spaced from the base and configured to move between corresponding unpressed and pressed positions relative to the base. The corresponding unpressed and pressed positions are separated by a corresponding first amount in a press direction and a corresponding second amount in a lateral direction orthogonal to the press direction. The corresponding first and second amounts may differ between keys. Also, the corresponding first and second amounts may have any appropriate relationship, including where the corresponding first amount is at least as much as the corresponding second amount and no larger than twice the corresponding second amount. Similarly, any angles associate with the motion of the keycaps can also differ between keys.

Each first linkage of the plurality of first linkages correspond to a keycap of the plurality of keycaps; also, each first linkage comprises a first base coupling portion rotatably coupled to the base at a corresponding first base revolute joint and a first keycap coupling portion rotatably coupled to the corresponding keycap at a corresponding first keycap revolute joint. The plurality of second linkages corresponds to a keycap of the plurality of keycaps. Each second linkage of the plurality of second linkages comprises a second base coupling portion rotatably coupled to the base at a corresponding second base revolute joint and a second keycap coupling portion rotatably coupled to the corresponding keycap at a corresponding second keycap revolute joint.

Thus, a keycap of the plurality of keycaps in this example keyboard may have corresponding first and second linkages. The keycap is configured to, in response to a press force applied to the keycap, move with substantially constant orientation relative to the base toward the corresponding pressed position. This is achieved through the first and second linkages. Specifically, the corresponding first linkage for the keycap rotates relative to the base about the corresponding first base revolute joint, and also rotates relative to the keycap about the corresponding first keycap revolute joint. Further, the corresponding second linkage rotates relative to the base about the corresponding second base revolute joint, and also rotates relative to the keycap about the corresponding second keycap revolute joint.

As can be seen in this example keyboard, some components may be shared when multiple touchsurfaces are placed in the same device. For example, the base may be shared by two or more touchsurfaces. As another example, the key-switch sensor may be shared through sharing sensor substrates, sensor electrodes, or the like. For example, the key-switch sensor may be enabled by a plurality of capacitive sensor electrodes configured as one capacitive sensor and used to detect pressed states of one or more keycaps of the plurality of keycaps.

The implementations described herein are meant as examples, and many variations are possible. As one example, any appropriate feature described with one implementation may be incorporated with another. As a first specific example, any of the implementations described herein may or may not utilize a finishing tactile, aesthetic, or protective layer. As a second specific example, ferrous material may be used to replace magnets in various magnetically coupled component arrangements.

In addition, the structure providing any function may comprise any number of appropriate components. For example, a same component may provide leveling, planar translation effecting, readying, and returning functions for a key press. As another example, different components may be provide these functions, such that a first component levels, a second component effects planar translation, a third component readies, and a fourth component returns. As yet another example, two or more components may provide a same function. For example, in some embodiments, magnets and springs together provide the return function, or the ready and return functions.

Further, it should be understood that the techniques described in the various implementations herein may be used in conjunction with each other, even where the function may seem redundant. For example, some embodiments use springs to back-up or augment magnetically-based ready/return mechanisms.

What is claimed is:

1. A key assembly comprising:
   a base;
   a keycap spaced from the base along a press direction, the keycap configured to move between an unpressed position and a pressed position relative to the base, wherein the unpressed and pressed positions are separated by a first amount in the press direction and a second amount in a lateral direction orthogonal to the press direction, and wherein the first amount is at least as much as the second amount and no larger than twice the second amount;
   a biasing mechanism configured to bias the keycap away from the base;
   a first linkage rotatably coupled to the base and rotatably coupled to the keycap; and
   a second linkage rotatably coupled to the base and rotatably coupled to the keycap,
   wherein, in response to press force applied to the keycap, the biasing mechanism resists keycap movement toward the pressed position, and the first and second linkages together maintain the keycap in a substantially constant orientation relative to the base while guiding the keycap toward the pressed position,
   wherein, in response to a removal of the press force, the biasing mechanism biases the keycap toward the impressed position, and
   wherein the biasing mechanism comprises magnetically attracted subcomponents configured to bias the keycap, the magnetically attracted subcomponents comprising at least one magnet,
   wherein the first linkage comprises a shaped wire,
   wherein the first linkage is rotatably coupled to the keycap at a first joint, wherein the keycap further comprises:
   a lip disposed over an undercut for retaining the shaped wire to form the first joint; and
   a pocket contiguous with the undercut, the pocket configured to allow the shaped wire to be deformed and slipped into the undercut to form the first joint without substantially deflecting the lip.

2. The key assembly of claim 1, wherein an angle between the first linkage and the base is no less than forty-five degrees and less than sixty-five degrees when the key cap is in the unpressed position, and no less than negative five degrees and no greater than fifteen degrees when the keycap is in the pressed position.

3. The key assembly of claim 1, wherein the first amount ranges from 0.5 mm to 1.4 mm, and wherein second amount ranges from 0.5 mm to 0.7 mm.

4. The key assembly of claim 1, further comprising a capacitive sensor electrode configured to detect a pressed state of the keycap.

5. The key assembly of claim 1, wherein the shaped wire comprises:
   a first base coupling portion rotatably coupled to the base at the first joint; and
   a second base coupling portion rotatably coupled to the base at second joint, wherein the shaped wire extends across most of a width of the keycap, and wherein the first and second joints are located proximate to opposite keycap edges located across the width of the keycap.

6. The key assembly of claim 1, wherein the first linkage is rotatably coupled to the base by a first living hinge, the second linkage is rotatably coupled to the base by a second living hinge, and the first linkage, the second linkage, and the base comprise different portions of a single piece part.

7. The key assembly of claim 6, wherein the keycap further comprises:
a first component configured to be seen and contacted by users; and
a second component attached to the first subcomponent, wherein the first and second linkages are rotatably coupled to the keycap by being rotatably coupled to the second subcomponent.

8. The key assembly of claim 1, wherein the at least one magnet is disposed on a lateral edge portion of at least one element selected from the group consisting of the keycap and the base.

9. A keyboard comprising:
a base;
a plurality of keycaps, each keycap of the plurality of keycaps spaced from the base and configured to move between corresponding unpressed and pressed positions relative to the base, wherein the corresponding unpressed and pressed positions are separated by a corresponding first amount in a press direction and a corresponding second amount in a lateral direction orthogonal to the press direction;
a plurality of biasing mechanisms configured to bias the plurality of keycaps away from the base;
a plurality of first linkages, each first linkage of the plurality of first linkages corresponding to a keycap of the plurality of keycaps and comprising a first base coupling portion rotatably coupled to the base at a corresponding first base revolute joint and a first keycap coupling portion rotatably coupled to the corresponding keycap at a corresponding first keycap revolute joint; and
a plurality of second linkages, each second linkage of the plurality of second linkages corresponding to a keycap of the plurality of keycaps and comprising a second base coupling portion rotatably coupled to the base at a corresponding second base revolute joint and a second keycap coupling portion rotatably coupled to the corresponding keycap at a corresponding second keycap revolute joint,
wherein each keycap of the plurality of keycaps is configured to, in response to press force applied to the keycap, move with substantially constant orientation relative to the base toward the corresponding pressed position by being guided by:
the corresponding first linkage rotating relative to the base about the corresponding first base revolute joint and rotating relative to the keycap about the corresponding first keycap revolute joint, and the corresponding second linkage rotating relative to the base about the corresponding second base revolute joint and rotating relative to the keycap about the corresponding second keycap revolute joint,
wherein the plurality of biasing mechanisms comprises magnetically attracted subcomponents configured to bias the plurality of keycaps, the magnetically attracted subcomponents comprising at least one magnet,
wherein, for a first keycap of the plurality of keycaps, the corresponding first linkage comprises a shaped wire extending across most of a width of the first keycap, the corresponding first linkage has a third base coupling portion rotatably coupled to the base at a corresponding third base revolute joint, and the corresponding first and third base revolute joints are located proximate to opposite keycap edges located across the width of the first keycap,
wherein the first keycap of the plurality of keycaps comprises:
a lip disposed over an undercut for retaining the shaped wire to form the corresponding first keycap revolute joint; and
a pocket contiguous with the undercut, the pocket configured to allow the shaped wire to be bent and slipped into the undercut to form the corresponding first keycap revolute joint without substantially deflecting the lip.

10. The keyboard of claim 9, wherein, for a first keycap of the plurality of keycaps, an angle between the corresponding first linkage and the base is no less than forty-five degrees and less than sixty-five degrees when the first keycap is in the corresponding unpressed position, and no less than negative five degrees and no greater than fifteen degrees when the first keycap is in the corresponding pressed position.

11. The keyboard of claim 9 further comprising:
a plurality of capacitive sensor electrodes configured to detect pressed states of the plurality of keycaps.

12. The keyboard of claim 9, wherein the plurality of first linkages comprises a first plurality of living hinges, wherein the plurality of second linkages comprises a second plurality of living hinges, and wherein the base, the plurality of first linkages, and the plurality of second linkages comprise different portions of a single piece part.

13. The keyboard of claim 9, wherein a first keycap of the plurality of keycaps comprises:
a first component configured to be seen and contacted by users; and
a second component attached to the first subcomponent, the second component comprising features configured to be coupled to the corresponding first and second linkages to form the corresponding first and second keycap revolute joints.

14. The keyboard of claim 9, wherein the at least one magnet is disposed on a lateral edge portion of at least one element selected from the group consisting of the plurality of keycaps and the base.

15. A method of assembling a key comprising:
forming a first revolute joint by:
deforming a first shaped wire,
locating a deformed part of the first shaped wire in a first pocket near an undercut located under a first lip, such that the first shaped wire can be positioned in the first undercut without substantially deflecting the first lip, and
positioning the first shaped wire in the undercut to form the first revolute joint;
forming a second revolute joint by:
deforming a second shaped wire,
locating a deformed part of the second shaped wire in a second pocket near a second undercut located under a second lip, such that the second shaped wire can be positioned in the second undercut without substantially deflecting the second lip, and
positioning the second shaped wire in the second undercut to form the second revolute joint; and
forming a third revolute joint by:
rotating the first shaped wire about the first revolute joint to a first snap-in orientation, and
snapping the first shaped wire into a first bearing to form the third revolute joint; and
forming a fourth revolute joint by:
rotating the second shaped wire about the second revolute joint to a second snap-in orientation, and
snapping the second shaped wire into a second bearing to form the fourth revolute joint, wherein the forming of the first, second, third, and fourth revolute joints couples a base attached to two revolute joints of the first, second, third, and fourth revolute joints with a keycap attached to the other two revolute joints of the first, second, third, and fourth revolute joints, and
wherein the first shaped wire, second shaped wire, base, and keycap form a quadrilateral four-bar mechanism with four revolute joints.

16. The method of claim 15, further comprising:
providing a biasing mechanism comprising magnetically attracted material, the biasing mechanism configured to bias the keycap away from the base using magnetic forces.

17. The method of claim 15, further comprising:
providing a capacitive sensor electrode configured to detect a pressed state of the keycap.

\* \* \* \* \*